US011322462B2

(12) United States Patent
Tsutsui et al.

(10) Patent No.: US 11,322,462 B2
(45) Date of Patent: May 3, 2022

(54) SEMICONDUCTOR DEVICE

(71) Applicant: Murata Manufacturing Co., Ltd., Kyoto (JP)

(72) Inventors: Takayuki Tsutsui, Kyoto (JP); Isao Obu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 176 days.

(21) Appl. No.: 16/223,597

(22) Filed: Dec. 18, 2018

(65) Prior Publication Data

US 2019/0198464 A1 Jun. 27, 2019

(30) Foreign Application Priority Data

Dec. 22, 2017 (JP) .............................. JP2017-245880
Apr. 12, 2018 (JP) .............................. JP2018-076757

(51) Int. Cl.
*H01L 23/66* (2006.01)
*H01L 23/528* (2006.01)
*H01L 23/00* (2006.01)
*H01L 49/02* (2006.01)
*H01L 29/737* (2006.01)
(Continued)

(52) U.S. Cl.
CPC .......... *H01L 23/66* (2013.01); *H01L 23/5286* (2013.01); *H01L 23/5381* (2013.01); *H01L 24/13* (2013.01); *H01L 24/14* (2013.01); *H01L 27/0658* (2013.01); *H01L 28/10* (2013.01); *H01L 28/40* (2013.01); *H01L 29/7371* (2013.01); *H03F 3/2178* (2013.01); *H01L 2223/6655* (2013.01); *H01L 2224/13025* (2013.01); *H01L 2224/13082* (2013.01); *H01L 2224/13101* (2013.01); *H01L 2224/13147* (2013.01); *H01L 2224/14515* (2013.01); *H01L 2924/1304* (2013.01); *H01L 2924/1306* (2013.01); *H01L 2924/30111* (2013.01); *H03F 1/565* (2013.01); *H03F 3/195* (2013.01); *H03F 2200/222* (2013.01); *H03F 2200/387* (2013.01); *H03F 2200/451* (2013.01); *H03H 7/38* (2013.01)

(58) Field of Classification Search
CPC . H01L 23/66; H01L 23/5286; H01L 27/0658; H01L 28/40; H01L 2223/6655; H01L 2924/30111
See application file for complete search history.

(56) References Cited

U.S. PATENT DOCUMENTS

| 4,200,880 A * | 4/1980 | Frey ................. H01L 23/66 |
| | | 228/179.1 |
| 2007/0296057 A1* | 12/2007 | Apel .................. H01L 23/66 |
| | | 257/531 |

(Continued)

OTHER PUBLICATIONS

Kang, et al., "A Highly Efficient and Linear Class—AB/F Power Amplifier for Multimode Operation", IEEE Transactions on Microwave Theory and Techniques, vol. 56, No. 1, Jan. 2008.

*Primary Examiner* — Tuan A Hoang
(74) *Attorney, Agent, or Firm* — Pearne & Gordon LLP

(57) ABSTRACT

A plurality of unit transistors that are connected in parallel to each other are formed on a substrate. In addition, a ground bump is provided on the substrate. A plurality of first capacitors are each provided for a corresponding one of the plurality of unit transistors and each connect an output electrode of the corresponding one of the plurality of unit transistors and the ground bump to each other.

16 Claims, 24 Drawing Sheets

(51) Int. Cl.
*H03F 3/217* (2006.01)
*H01L 27/06* (2006.01)
*H01L 23/538* (2006.01)
H03F 1/56 (2006.01)
H03F 3/195 (2006.01)
H03H 7/38 (2006.01)

(56) References Cited

U.S. PATENT DOCUMENTS

| | | | |
|---|---|---|---|
| 2011/0031571 A1* | 2/2011 | Bouisse | H01L 23/66 |
| | | | 257/428 |
| 2014/0077883 A1* | 3/2014 | Griffith | H01L 29/778 |
| | | | 330/296 |
| 2017/0117204 A1* | 4/2017 | McPartlin | H03F 3/211 |
| 2017/0162500 A1* | 6/2017 | Lee | H01L 23/5223 |

* cited by examiner

1GHz-10GHz

SEMICONDUCTOR DEVICE

This application claims priority from Japanese Patent Application No. 2017-245880 filed on Dec. 22, 2017 and Japanese Patent Application No. 2018-076757 filed on Apr. 12, 2018. The content of these applications are incorporated herein by reference in their entireties.

BACKGROUND OF THE DISCLOSURE

1. Field of the Disclosure

The present disclosure relates to a semiconductor device.

2. Description of the Related Art

Main components of a mobile terminal include a high-frequency power amplifier. As a technique to increase the transmission capacitance of a mobile terminal, one regarding a plurality of frequency bands, such as carrier aggregation, has been attracting attention. With an increase in the frequency bands, a front-end circuit configuration of a mobile terminal including a wireless frequency power amplifier, a filter, and a switch becomes more complex.

As for a fifth-generation mobile communication system, to use a sub-6 GHz frequency band and a 10 GHz or more frequency band, the front-end circuit configuration becomes even more complex. The complexity of the front-end circuit configuration increases the load loss of a power amplifier. Thus, the power amplifier needs not only to support a plurality of frequency bands, but also to output more power.

IEEE Trans. on Microwave Theory and Techniques, Vol. 56, No. 1, January 2008, discloses a power amplifier that performs an efficiency-enhanced Class F amplification operation. In the Class F amplification operation, a matching circuit is adjusted such that the load impedance becomes zero (short-circuited) at even-order harmonics and becomes infinite (open) at odd-order harmonics. The above document also discloses a series resonant circuit that makes the load impedance short-circuited at a second-order harmonic and open at a third-order harmonic. It is also possible to make the load impedance open at a second-order harmonic and short-circuited at a third-order harmonic so as to enhance the efficiency, and such an amplification operation is called an inverse Class F amplification operation.

BRIEF SUMMARY OF THE DISCLOSURE

In order to obtain a large output, in some cases, transistors in an output stage are configured such that a plurality of unit transistors are connected in parallel. For example, a plurality of unit transistors are formed on a substrate, and a collector of each of the unit transistors is connected to a common output wiring. A series resonant circuit for a Class-F amplification operation or an inverse Class-F amplification operation is connected to the output wiring. According to the simulation performed by the present inventors on a high-frequency amplifier circuit including the plurality of unit transistors, it is found that an inductance component of the output wiring interferes with an efficiency-enhanced operation.

Accordingly, it is an object of the present disclosure to provide a semiconductor device that can perform an efficiency-enhanced operation in high-frequency power amplification.

According to preferred embodiments of the present disclosure, a semiconductor device includes a plurality of unit transistors that are formed on a substrate, the plurality of unit transistors each including an output electrode for outputting an output signal, an input electrode for inputting an input signal, and a common electrode, the plurality of unit transistors being connected in parallel to each other; a ground bump provided on the substrate; and a plurality of first capacitors that are each provided for a corresponding one of the plurality of unit transistors, the plurality of first capacitors each connecting the output electrode of the corresponding one of the plurality of unit transistors and the ground bump to each other.

A capacitance of each of the first capacitors and an inductance component of a current path and the ground bump, the current path being a path from each of the unit transistors to the ground bump, serve as a harmonic-termination series resonant circuit. Since the first capacitors are provided for the respective plurality of unit transistors, resonant frequencies seen from the respective plurality of unit transistors toward the series resonant circuits can be made uniform. Since the resonant frequencies of the harmonic-termination series resonant circuits are made uniform, for example, a power amplifier circuit can operate at enhanced efficiency.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Before description of embodiments of the present disclosure, a semiconductor device according to a reference example will be described with reference to FIGS. 23, 24A, and 24B.

Figure 23:
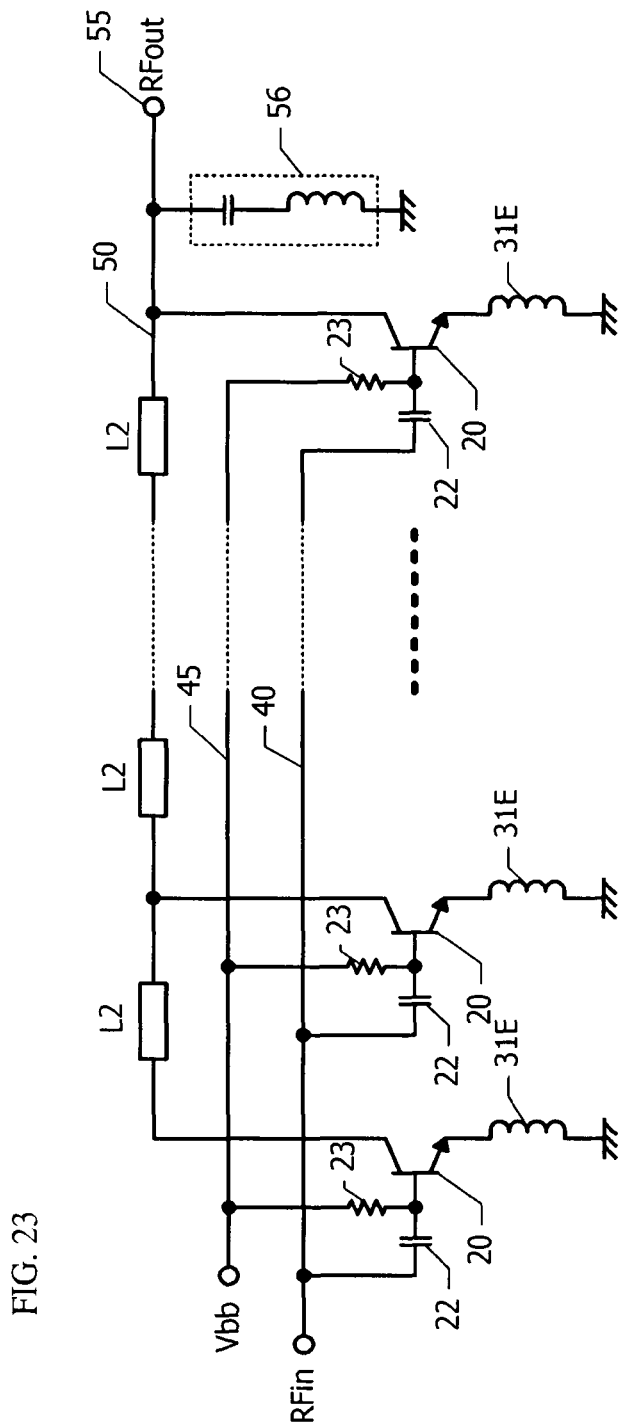
FIG. 23 is an equivalent circuit diagram of the semiconductor device according to the reference example.

FIG. 23 is an equivalent circuit diagram of the semiconductor device according to the reference example. The semiconductor device according to the reference example includes a plurality of unit transistors 20. An element having the minimum components of a transistor is herein referred to as a "unit transistor". An emitter of each of the plurality of unit transistors 20 is grounded via an emitter wiring 31E having an inductance component. A base of each of the unit transistors 20 is connected to a common input wiring 40 with an input capacitor 22 interposed therebetween. A high-frequency input signal RFin is supplied through the input wiring 40 to the unit transistors 20. The base of each of the unit transistors 20 is further connected to a common base bias wiring 45 with a ballast resistor 23 interposed therebetween. A base bias Vbb is supplied through the base bias wiring 45 and the ballast resistor 23 to the base of each of the unit transistors 20.

A collector of each of the unit transistors 20 is connected to a common output wiring 50. An end of the output wiring 50 is connected to an output terminal 55. An amplified output signal RFout is outputted from the output terminal 55. The output wiring 50 is connected to a harmonic-termination series resonant circuit 56 near the output terminal 55 (at a right end in FIG. 23). The output wiring 50 has inductance components L2. The series resonant circuit 56 in FIG. 23 includes an inductance and a capacitance. On the other hand, a configuration in which a capacitance is connected to a distributed constant line that is grounded at one end also works as a series resonant circuit at a frequency of 5 GHz or higher.

The length of the output wiring 50 from the unit transistors 20 to the series resonant circuit 56 differs for each of the unit transistors 20. Accordingly, the inductance components L2 of the output wiring 50 from the unit transistors 20 to the series resonant circuit 56 also differ for each of the unit transistors 20.

In order to cause a power amplifier circuit including the plurality of unit transistors 20 to perform an inverse Class F amplification operation, a load impedance of a third-order harmonic of the high-frequency input signal RFin needs to be short-circuited. However, since the inductance components L2 of the output wiring 50 differ for each of the unit transistors 20, the frequency characteristics obtained from the inductance components L2 and the series resonant circuit 56 also differ for each of the unit transistors 20. The frequency characteristics of the series resonant circuit 56 with different inductance components L2 were evaluated by simulation. The results of the evaluation by the simulation will be described below.

Figure 24A:
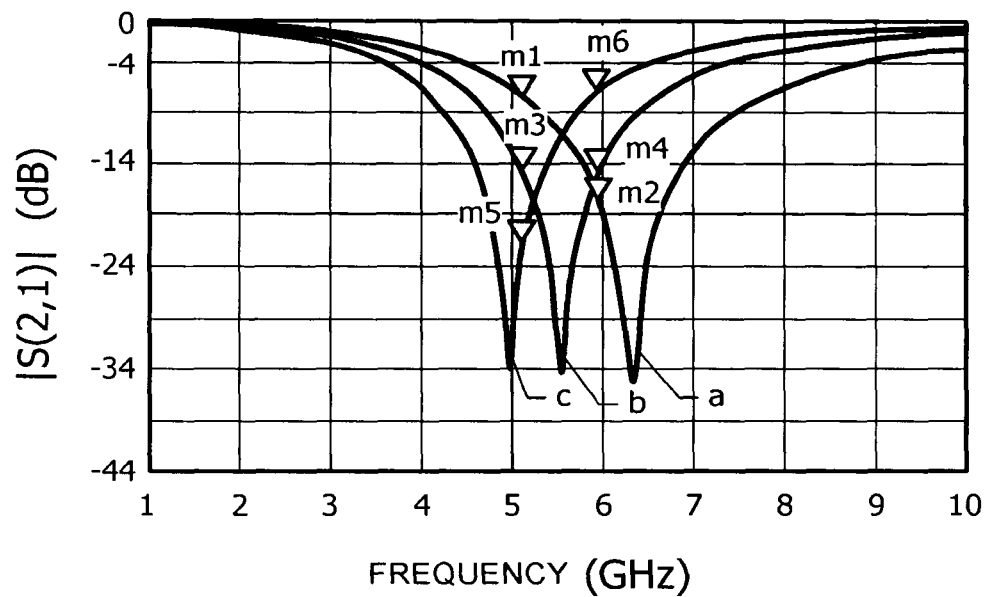
FIG. 24A is a graph illustrating the simulation results of the bandpass characteristics |S(2,1)| seen from the unit transistors of the semiconductor device according to the reference example toward a series resonant circuit through an output wiring.

FIG. 24A is a graph illustrating the simulation results of the bandpass characteristics |S(2,1)| seen from the unit transistors 20 toward the series resonant circuit 56 through the output wiring 50.

The horizontal axis of FIG. 24A represents the frequency in "GHz", and the vertical axis thereof represents the bandpass characteristics |S(2,1)| in "dB". The larger the negative value of the bandpass characteristics |S(2,1)| is, the larger the attenuation is. The simulation was conducted on three cases in which the length of the output wiring 50 (FIG. 23) from the unit transistors 20 to the series resonant circuit 56 differs. Curves a, b, and c illustrated in FIG. 24A respectively represent the bandpass characteristics |S(2,1)| seen from a rightmost unit transistor 20, a central unit transistor 20, and a leftmost unit transistor 20 toward the series resonant circuit 56 in FIG. 23. The length of the output wiring 50 from the rightmost unit transistor 20 to the series resonant circuit 56 is substantially a null. The closer the unit transistor 20 is to the left end, the longer the output wiring 50 from the unit transistor 20 to the series resonant circuit 56 is, and the larger the inductance component L2 is.

As the length of the output wiring 50 from the unit transistor 20 to the series resonant circuit 56 increases, the frequency at which the bandpass characteristic |S(2,1)| reaches a minimum becomes lower. When focusing on a certain frequency, it is found that the attenuation largely changes depending on the length of the output wiring 50. For example, the bandpass characteristic |S(2,1)| at a frequency of 5.13 GHz becomes −7.4 dB (triangle m1), −14.5 dB (triangle m3), and −21.8 dB (triangle m5) with an increase in the length of the output wiring 50. In addition, the bandpass characteristic |S(2,1)| at a frequency of 5.94 GHz becomes −17.6 dB (triangle m2), −15.2 dB (triangle m4), and −7.0 dB (triangle m6) with an increase in the length of the output wiring 50.

Figure 24B:
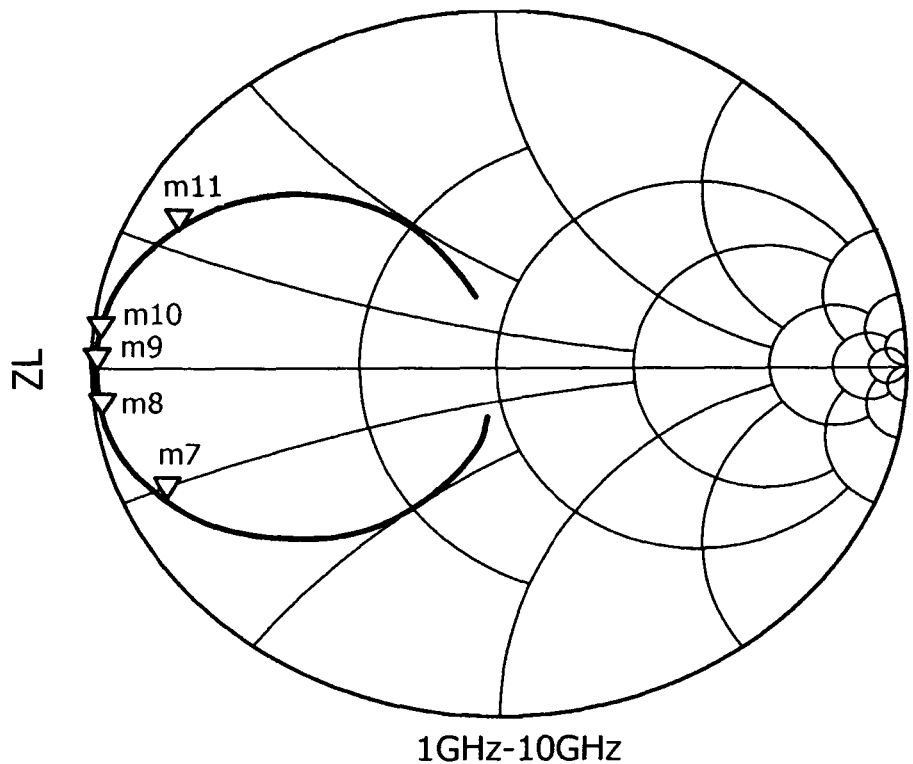
FIG. 24B is a graph illustrating, on a Smith chart, the simulation results of the load impedances seen from the unit transistors of the semiconductor device according to the reference example toward the series resonant circuit through the output wiring.

FIG. 24B is a graph illustrating, on a Smith chart, the simulation results of the load impedances ZL seen from the unit transistors 20 toward the series resonant circuit 56 through the output wiring 50. A thick solid line in FIG. 24B represents loci of the load impedances ZL when the frequency is changed from 1 GHz to 10 GHz. Even if the length of the output wiring 50 differs, the loci of the load impedances ZL substantially overlap with each other.

The load impedance ZL seen from the central unit transistor 20 toward the series resonant circuit 56 at a frequency of 5.5 GHz corresponds to the position of triangle m9. Thus, a substantially short-circuit impedance (the value of the impedance is substantially zero) is realized.

The load impedances ZL seen from the rightmost and leftmost unit transistors 20 toward the series resonant circuit 56 at a frequency of 5.13 GHz correspond to the positions of triangles m7 and m10, respectively. At the frequency of 5.13 GHz, a substantially short-circuit impedance is realized for the leftmost unit transistor 20 while a short-circuit impedance is not realized for the rightmost unit transistor 20.

The load impedances ZL seen from the rightmost and leftmost unit transistors 20 toward the series resonant circuit 56 at a frequency of 5.94 GHz correspond to the positions of triangles m8 and m11, respectively. At the frequency of 5.94 GHz, a substantially short-circuit impedance is realized for the rightmost unit transistor 20 while a short-circuit impedance is not realized for the leftmost unit transistor 20.

For example, when a third-order harmonic frequency is in a range of 5 GHz to 6 GHz inclusive, the third-order harmonic bandpass characteristics |S(2,1)| and the load impedances ZL differ to a non-negligible extent depending on the position of the unit transistor 20. In a case of causing an amplifier circuit including the plurality of unit transistors 20 to perform an inverse Class F amplification operation, it is desired to make the third-order harmonic bandpass characteristics |S(2,1)| and the load impedances ZL uniform in all of the unit transistors 20. However, in a case of performing the inverse Class F amplification operation to amplify a signal for which a third-order harmonic becomes 5 GHz or higher, the inductance component of the output wiring 50 is non-negligible. Therefore, it is difficult to make the third-order harmonic bandpass characteristics |S(2,1)| and the load impedances ZL uniform. In the following embodiments, it is possible to make the third-order harmonic bandpass characteristics |S(2,1)| and the load impedances ZL substantially uniform, for example, in the plurality of unit transistors 20.

First Embodiment

Now, a semiconductor device according to a first embodiment will be described with reference to FIGS. 1 to 7B.

Figure 1:
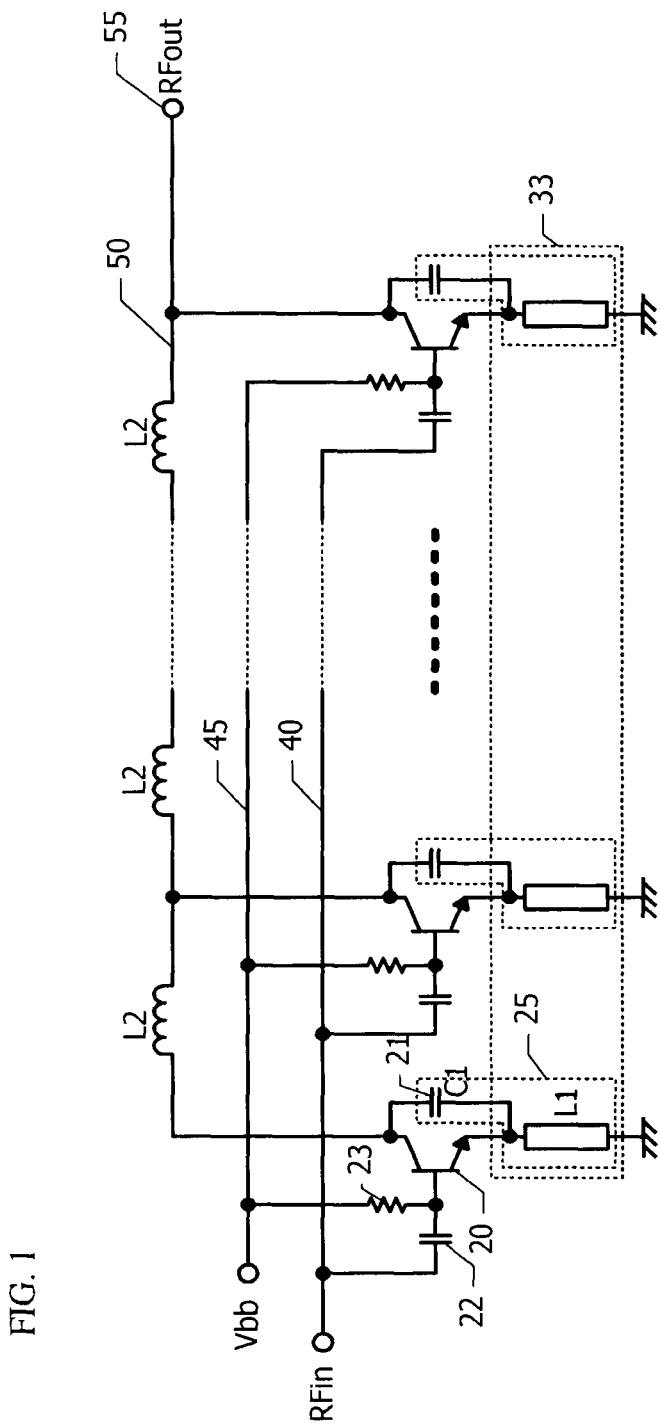
FIG. 1 is an equivalent circuit diagram of a semiconductor device according to a first embodiment.

FIG. 1 is an equivalent circuit diagram of the semiconductor device according to the first embodiment. The semiconductor device according to the first embodiment includes the plurality of unit transistors 20 connected in parallel to each other. Each of the unit transistors 20 is a heterojunction bipolar transistor (HBT) and includes a collector, a base, and an emitter. The base is connected to an input electrode to which an input signal is inputted, the collector is connected to an output electrode from which an output signal is outputted, and the emitter is connected to a common electrode at the input side and the output side.

The emitter of each of the plurality of unit transistors 20 is grounded via an emitter wiring and a ground bump 33. In each of the unit transistors 20, the emitter wiring and the ground bump 33 have substantially the same inductance component L1.

The base of each of the unit transistors 20 is connected to the common input wiring 40 with the input capacitor 22 interposed therebetween and is also connected to the common base bias wiring 45 with the ballast resistor 23 interposed therebetween. The high-frequency input signal RFin is inputted to the base of each of the unit transistors 20 through the input wiring 40 and the input capacitor 22. The base bias Vbb is supplied to the base of each of the unit transistors 20 through the base bias wiring 45 and the ballast resistor 23.

The collector of each of the unit transistors 20 is connected to the common output wiring 50. An end of the output wiring 50 is connected to the output terminal 55. The output signal RFout that is amplified by the unit transistors 20 is outputted from the output terminal 55 through the output wiring 50. The output wiring 50 has the inductance components L2.

A first capacitor 21 is connected between the collector of each of the unit transistors 20 and the ground bump 33, and a plurality of first capacitors 21 have substantially the same capacitance C1. The collector of each of the unit transistors 20 is grounded via a series resonant circuit 25. The series resonant circuit 25 includes the capacitance C1 of the first capacitor 21 and the inductance component L1 of the emitter wiring and the ground bump 33. The series resonant circuit 25 serves as a harmonic-termination series resonant circuit that terminates a harmonic outputted from the unit transistor 20.

Figure 2:
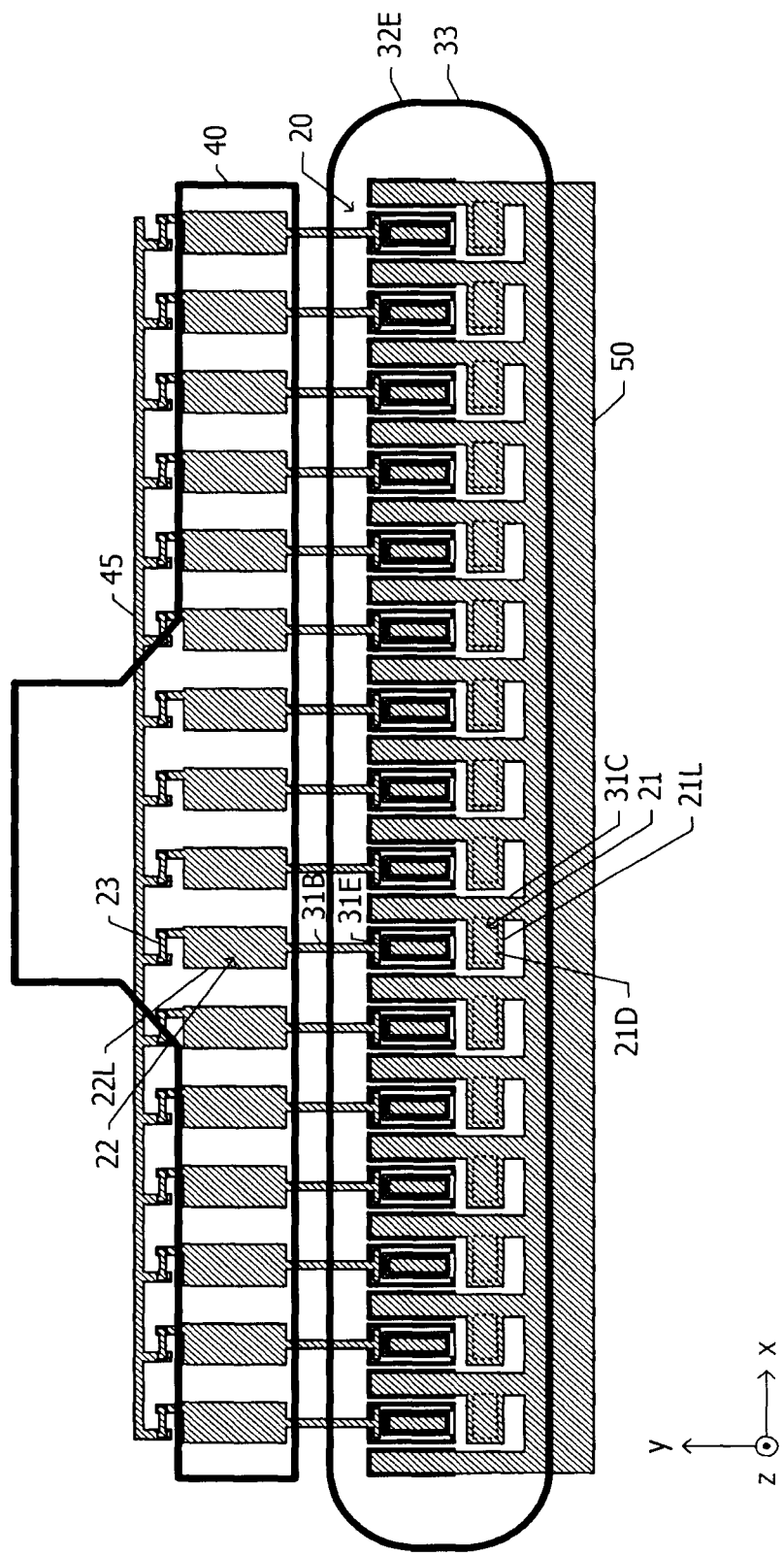
FIG. 2 is a plan view of the semiconductor device according to the first embodiment.

FIG. 2 is a plan view of the semiconductor device according to the first embodiment. The plurality of unit transistors 20 are arranged in a line on a surface of a semiconductor substrate. Although FIG. 2 illustrates an example in which the number of the unit transistors 20 arranged in a line is 16, the number of the unit transistors 20 may be any other number. An xyz Cartesian coordinate system is defined in which the arrangement direction of the plurality of unit transistors 20 is an x-axis direction and a normal direction of the surface of the substrate is a positive z-axis direction.

Figure 3:
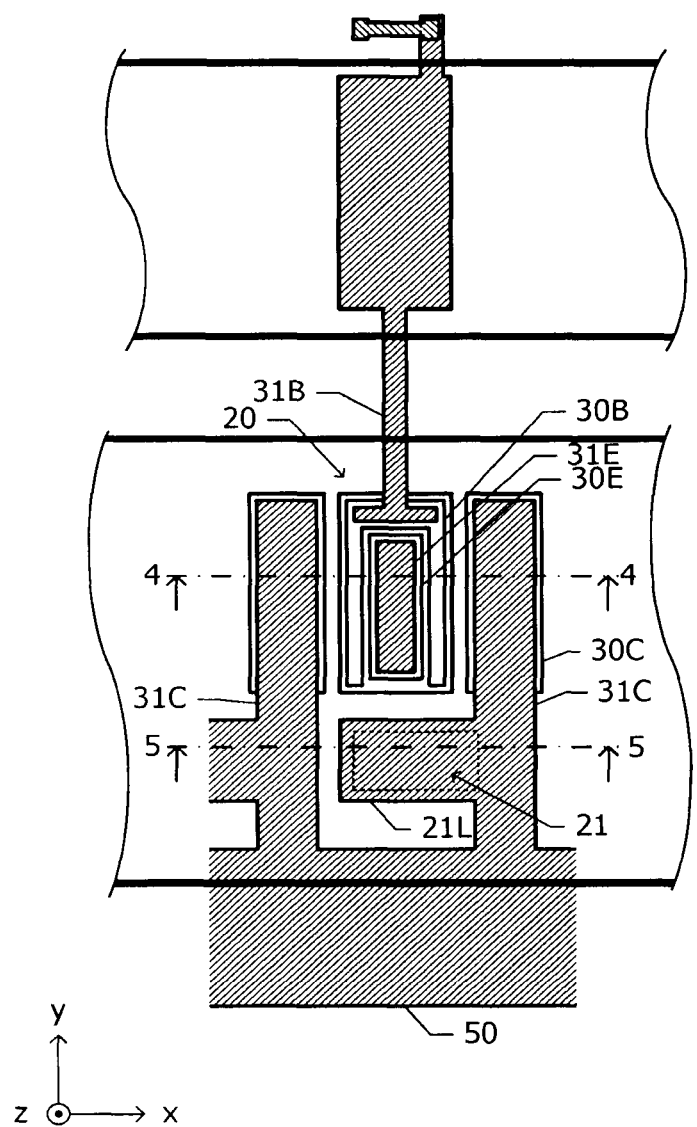
FIG. 3 is an enlarged plan view of one of unit transistors of the semiconductor device according to the first embodiment and a periphery thereof.

FIG. 3 is an enlarged plan view of one of the unit transistors 20 and a periphery thereof. Each of the unit transistors 20 includes an emitter electrode (common electrode) 30E, a base electrode (input electrode) 30B, and a collector electrode (output electrode) 30C. The emitter electrode 30E, the base electrode 30B, and the collector electrode 30C are respectively connected to the first-layer emitter wiring 31E, a first-layer base wiring 31B, and a first-layer collector wiring 31C. In FIG. 3, the first-layer emitter wiring 31E, the first-layer base wiring 31B, the first-layer collector wiring 31C, and other first-layer conductor patterns are hatched.

The emitter electrode 30E has a rectangular plan shape that is long in a y-axis direction. In a plan view, the base electrode 30B surrounds the emitter electrode 30E from three directions, which are both sides in the x-axis direction and one side in the y-axis direction (positive y-axis direction), in a U shape. Two collector electrodes 30C are provided for each one of the unit transistors 20, and the two collector electrodes 30C sandwich the base electrode 30B in the x-axis direction. The collector electrodes 30C other than the collector electrodes 30C provided at both ends in the x-axis direction are shared by two unit transistors 20 that are adjacent to each other.

The first-layer emitter wiring 31E entirely or almost entirely overlaps with the emitter electrode 30E. The first-layer base wiring 31B overlaps with the base electrode 30B at a portion in the positive y-axis direction relative to the emitter electrode 30E and extends from the overlapping portion in the positive y-axis direction. The first-layer collector wiring 31C overlaps with the collector electrode 30C and extends from the overlapping portion in the negative y-axis direction to be connected to the output wiring 50. The output wiring 50 is provided in the same first-layer wiring layer as the collector wiring 31C and is formed in the same conductor pattern as the collector wiring 31C.

In a region sandwiched between the first-layer emitter wiring 31E and the output wiring 50 in the y-axis direction, a lower electrode 21L of the first capacitor 21 is provided. The lower electrodes 21L is connected to the single collector wiring 31C (in the positive x-axis direction in FIG. 2). The lower electrode 21L is provided in the same wiring layer as the first-layer collector wiring 31C and is formed in the same conductor pattern as the collector wiring 31C.

As illustrated in FIG. 2, a second-layer emitter wiring (ground wiring) 32E that is long in the x-axis direction is provided so as to overlap with the plurality of unit transistors 20 and the lower electrodes 21L. The ground bump 33 having substantially the same plan shape as the second-layer emitter wiring 32E is provided so as to overlap with the second-layer emitter wiring 32E. When the semiconductor device according to the first embodiment is mounted on a printed wiring board or a package substrate, the ground bump 33 is connected to a ground of the printed wiring board or the package substrate.

A current path and the ground bump 33, the current path being a path from the collector electrode 30C (FIG. 3) to the ground bump 33 through the first-layer collector wiring 31C and the first capacitor 21, have an inductance component L1 (FIG. 1). The capacitance C1 of the first capacitor 21 and the inductance component L1 form the series resonant circuit 25 (FIG. 1). At a frequency domain exceeding 5 GHz, a physical distance of a conductor part from the ground bump 33 to the ground of the printed wiring board or the package substrate is non-negligible, and thus the conductor part serves as a distributed constant line. As a result, the capacitance C1 and the distributed constant line serve as a series resonant circuit.

In a region where the lower electrode 21L provided in the first-layer wiring layer and the emitter wiring 32E provided in the second-layer wiring layer overlap with each other, a capacitor dielectric film 21D having a higher permittivity than a surrounding insulating film is provided. The capacitor dielectric film 21D is provided between the lower electrode 21L and the second-layer emitter wiring 32E. The lower electrode 21L, the capacitor dielectric film 21D, the emitter wiring 32E, and the ground bump 33 form the first capacitor 21. The emitter wiring 32E and the ground bump 33 are used as an upper electrode of the first capacitor 21.

The plurality of first capacitors 21 are arranged in a direction parallel to the direction (x-axis direction) of the arrangement of the plurality of unit transistors 20. The arrangement period of the plurality of first capacitors 21 is the same as the arrangement period of the plurality of unit transistors 20. That is, the collector electrodes 30C of the unit transistors 20 and the first capacitors 21, the collector electrodes 30C and the first capacitors 21 corresponding to each other, have the same relative position relationship in all combinations of the unit transistors 20 and the first capacitors 21.

The first-layer base wirings 31B extending from the respective unit transistors 20 in the positive y-axis direction (up direction in FIG. 2) are connected to lower electrodes 22L of the input capacitors 22. The plurality of lower electrodes 22L are provided so as to correspond to the plurality of unit transistors 20 and are arranged in the x-axis direction. The lower electrodes 22L are provided in the same first-layer wiring layer as the base wirings 31B and are formed in the same conductor pattern as the base wirings 31B.

The lower electrodes 22L are connected to the base bias wiring 45 with the ballast resistors 23 interposed therebetween. The base bias wiring 45 and the ballast resistors 23 are provided in the same first-layer wiring layer as the lower electrodes 22L.

The input wiring 40 extending in the x-axis direction overlaps with the plurality of lower electrodes 22L. At portions where the input wiring 40 and each of the lower electrodes 22L overlaps with each other, the input capacitor 22 is formed. The input wiring 40 is provided in the second-layer wiring layer.

Figure 4:
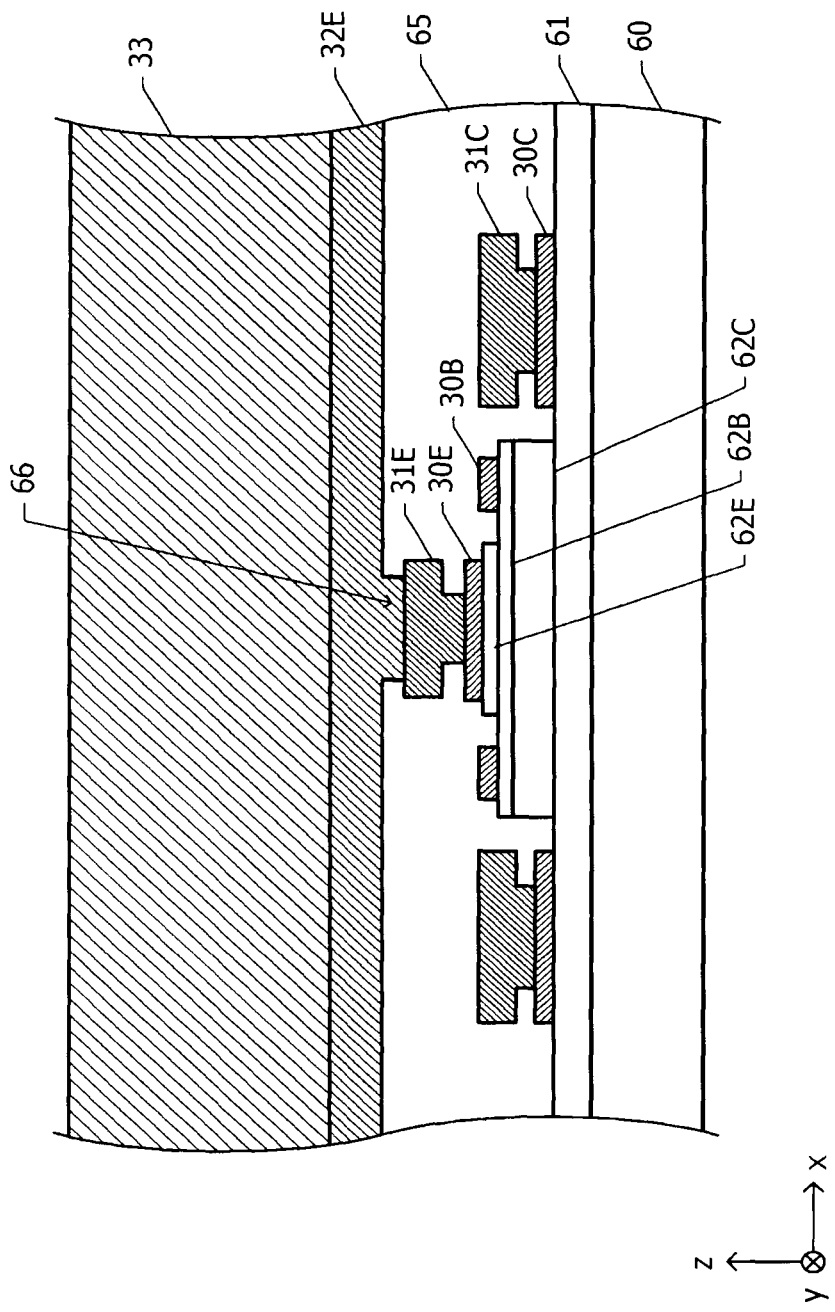
FIG. 4 is a sectional view taken along the dashed-and-dotted line 4-4 in FIG. 3.

FIG. 4 is a sectional view taken along the dashed-and-dotted line 4-4 in FIG. 3. On a semiconductor substrate 60, an n-type sub-collector layer 61, an n-type collector layer 62C, a p-type base layer 62B, and an n-type emitter layer 62E are stacked. The collector layer 62C, the base layer 62B, and the emitter layer 62E form the unit transistor 20. The unit transistor 20 is, for example, a heterojunction bipolar transistor (HBT).

The collector electrode 30C is provided on the sub-collector layer 61. Between the collector electrode 30C and the collector layer 62C, a collector current flows through the sub-collector layer 61. The base electrode 30B is provided on the base layer 62B. The emitter electrode 30E is provided on the emitter layer 62E. On the collector electrode 30C, the first-layer collector wiring 31C is provided. On the emitter electrode 30E, the first-layer emitter wiring 31E is provided.

The first-layer collector wiring 31C, the emitter wiring 31E, and the unit transistor 20 are covered with an interlayer insulating film 65 formed on the substrate 60. The second-layer emitter wiring 32E is provided on the interlayer insulating film 65. Through an opening 66 in the interlayer insulating film 65, the second-layer emitter wiring 32E is connected to the emitter electrode 30E with the first-layer emitter wiring 31E interposed therebetween. The ground bump 33 is provided on the second-layer emitter wiring 32E. The ground bump 33 may be formed by using, for example, a copper pillar bump structure including a metal post formed of copper and solder provided on a top surface of the metal post.

Figure 5:
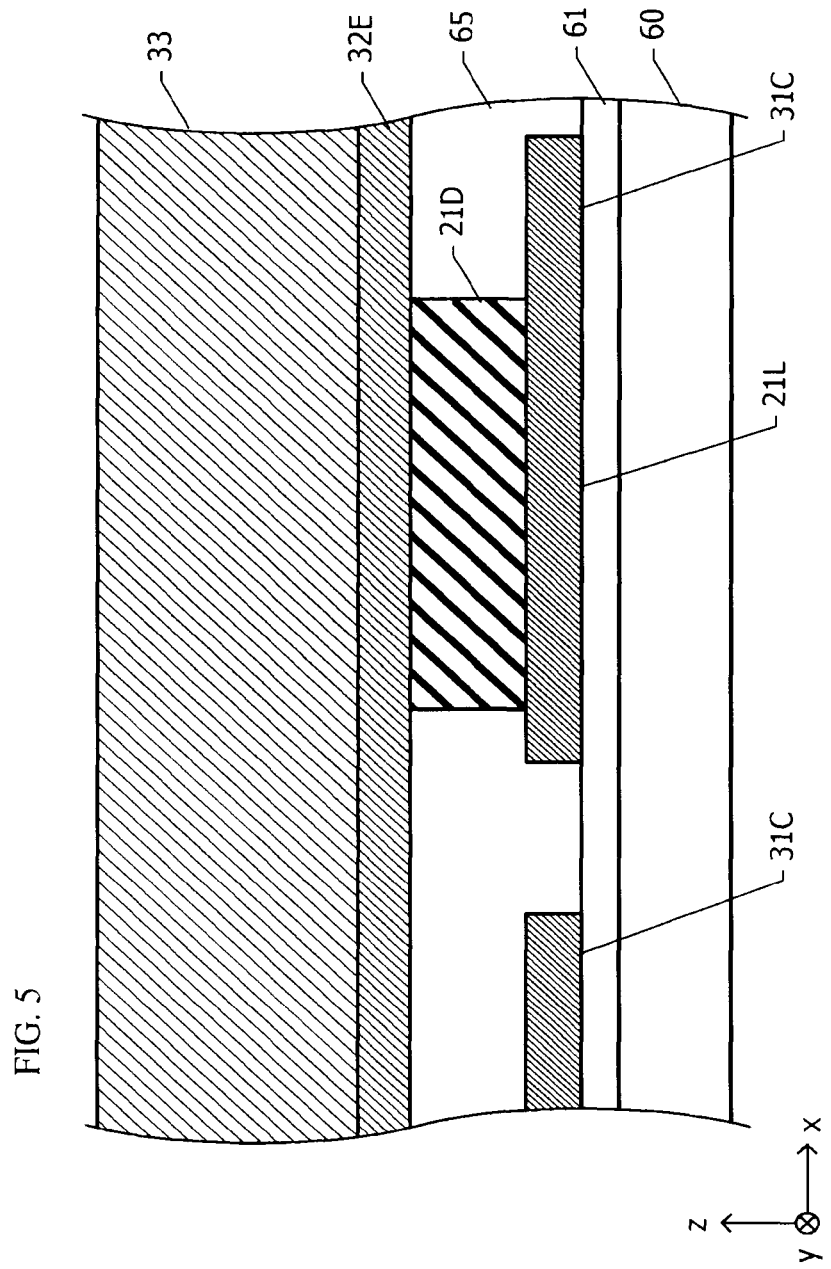
FIG. 5 is a sectional view taken along the dashed-and-dotted line 5-5 in FIG. 3.

FIG. 5 is a sectional view taken along the dashed-and-dotted line 5-5 in FIG. 3. In a section illustrated in FIG. 5, an insulating property is imparted to the sub-collector layer 61 by ion implantation. On the insulating sub-collector layer 61, the first-layer collector wiring 31C and the lower electrode 21L are provided. The first-layer collector wiring 31C and the lower electrode 21L are covered with the interlayer insulating film 65. An opening is formed in a region of the interlayer insulating film 65 overlapping with the lower electrode 21L, and the capacitor dielectric film 21D having a higher permittivity than the interlayer insulating film 65 is provided in the opening. On the interlayer insulating film 65 and the capacitor dielectric film 21D, the second-layer emitter wiring 32E is provided. On the second-layer emitter wiring 32E, the ground bump 33 is provided.

Next, advantageous effects obtained by using the configuration of the semiconductor device according to the first embodiment will be described.

In the first embodiment, the harmonic-termination series resonant circuits 25 (FIG. 1) are provided for the respective unit transistors 20. The current paths from the collector electrodes 30C (FIG. 3) of the respective unit transistors 20 to the ground bump 33 through the first capacitors 21 have substantially the same geometric shape and dimension in all of the unit transistors 20. In addition, the inductance components with respect to a current flowing through the ground bump 33 in a height direction are also substantially the same in all of the unit transistors 20. Thus, the impedances seen from the unit transistors 20 toward the series resonant circuits 25 are substantially uniform, not influenced by the length of the output wiring 50. This makes it possible to make the frequency characteristics of the harmonic-termination series resonant circuits 25 uniform in all of the unit transistors 20.

In order to make the frequency characteristics of the harmonic-termination series resonant circuits 25 uniform in all of the unit transistors 20, it is preferable to set the capacitances C1 of the first capacitors 21 (FIG. 1) provided in all of the unit transistors 20 to be substantially the same. In addition, it is also preferable to set the inductance components L1 that are present in all of the unit transistors 20 to be substantially the same. Note that the phrases "substantially the same capacitance" and "substantially the same inductance component" herein mean that the fluctuations of the capacitance and inductance component are allowable as long as the frequency characteristics can be regarded as being substantially uniform in a frequency domain of a harmonic of an input signal when seeing from the plurality of unit transistors 20 toward the series resonant circuits 25. When the resonant frequencies of the series resonant circuits 25 corresponding to the unit transistors 20 fall within ±3% with reference to a design resonant frequency, the frequency characteristics of the series resonant circuits 25 can be regarded as being substantially uniform. In addition, at a design high-order harmonic that is to be short-circuited, when a difference between a maximum and a minimum of the bandpass characteristics |S(2,1)| corresponding to the respective unit transistors 20 is 3 dB or less, the frequency characteristics of the series resonant circuits 25 can be regarded as being substantially uniform. If the frequency characteristics of the series resonant circuits 25 are substantially uniform, the capacitances C1 are substantially the same, and the inductance components L1 are also substantially the same.

Next, the values of the inductance components L1 (FIG. 1) and the capacitances C1 (FIG. 1) to use the inductance components L1 and the capacitances C1 as the harmonic-termination series resonant circuits 25 (FIG. 1) will be described with reference to FIGS. 6A and 6B.

The bandpass characteristics |S(2,1)| and the load impedances ZL seen from the unit transistors 20 toward the series resonant circuits 25 (FIG. 1) in a case where the capacitances C1 of the series resonant circuits 25 are changed to set the inductance components L1 to zero were obtained by simulation.

Figure 6A:
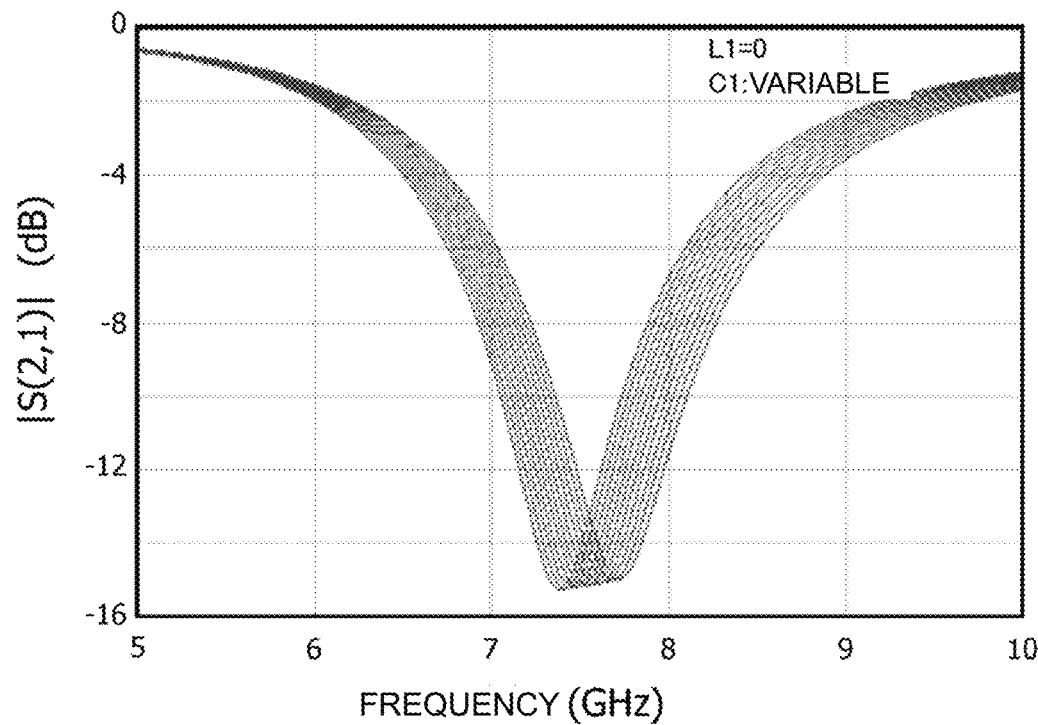
FIG. 6A is a graph illustrating the simulation results of the bandpass characteristics |S(2,1)| seen from the unit transistors of the semiconductor device according to the first embodiment toward a load side.

FIG. 6A is a graph illustrating the simulation results of the bandpass characteristics |S(2,1)|. The horizontal axis represents the frequency in "GHz", and the vertical axis represents the bandpass characteristics |S(2,1)| in "dB". A plurality of curves illustrated in FIG. 6A represent a plurality of examples in which the values of the capacitances C1 of the series resonant circuits 25 are different from one another. As an example, when a basic frequency of a high-frequency input signal is 2.5 GHz, a third-order harmonic frequency is 7.5 GHz. FIG. 6A illustrates the results of the simulation performed in the vicinity of 7.5 GHz, which is the third-order harmonic frequency. In the vicinity of 7.5 GHz, the bandpass characteristic |S(2,1)| reaches a minimum.

Figure 6B:
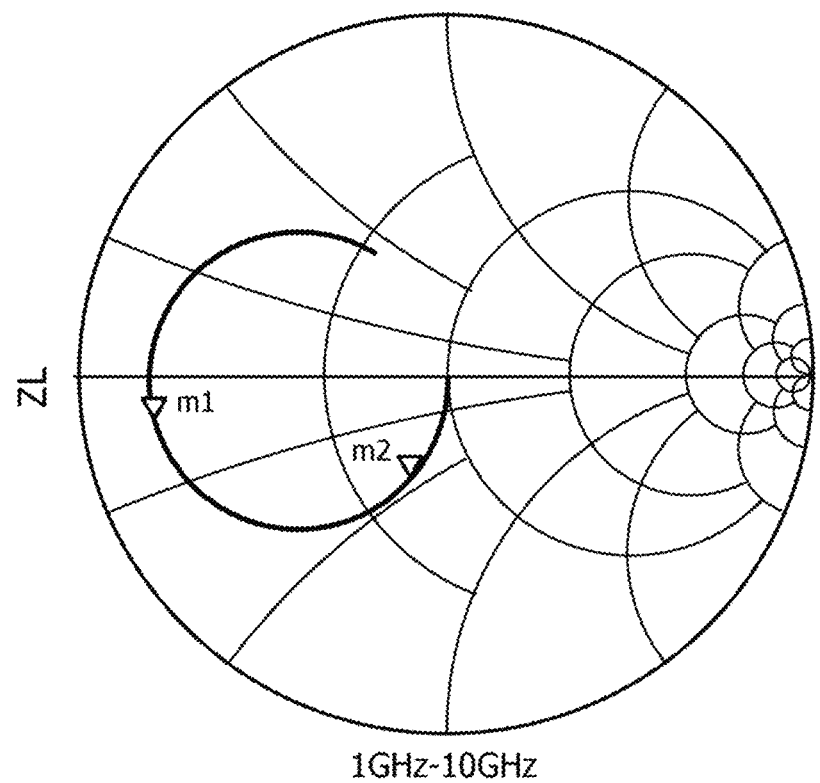
FIG. 6B is a graph illustrating the simulation results of the load impedances on a Smith chart.

FIG. 6B is a graph illustrating the simulation results of the load impedances ZL on a Smith chart. A thick solid line represents loci of the load impedances ZL when the frequency is changed from 1 GHz to 10 GHz. In FIG. 6B, the loci of the load impedances ZL with respect to the plurality of curves illustrated in FIG. 6A substantially overlap with each other. In the following case, the capacitances C1 of the series resonant circuits 25 are set to 3.8 pF, and the inductance components L1 are set to 0. In this case, the load impedance ZL at 7.5 GHz, which is the third-order harmonic frequency, is represented by triangle m1, and the load impedance ZL at 5.0 GHz, which is a second-order harmonic frequency, is represented by triangle m2.

It is found that the load impedance with respect to the third-order harmonic is set to a short condition compared with the load impedance with respect to the second-order harmonic. This satisfies a condition for an inverse Class F amplification operation.

As described above, even under a condition where the inductance components L1 are set to 0, if the capacitances C1 are set to about 3.8 pF, the load impedance with respect to the third-order harmonic (7.5 GHz) can be set to the short condition compared with that with respect to the second-order harmonic (5.0 GHz). The inductance components L1 of the first-layer collector wirings 31C and the ground bump 33 are minute, and are, for example, about several tens pH. From the simulation results illustrated in FIGS. 6A and 6B, it is possible to select such capacitances C1 that satisfy a condition for an inverse Class F amplification operation even if the inductance components L1 are minute.

Since the plurality of unit transistors 20 are connected in parallel in the first embodiment, a combined capacitance obtained by connecting in parallel, the capacitances C1 of the first capacitors 21, which are connected to the respective unit transistors 20, are set to about 3.8 pF. As an example, the combined capacitance may be adjusted to be 5 pF or less. In a case where ten unit transistors 20 are connected in parallel, each of the capacitances C1 of the first capacitors 21 may be set to 0.5 pF or less. Once the capacitances C1 are set in the above manner, if the third-order harmonic is about 7.5 GHz, the output impedance of the third-order harmonic can be close to the short condition. This makes it possible to realize an efficiency-enhanced inverse Class F amplification operation. On the other hand, if the basic frequency is 4 GHz or higher and the second-order harmonic is about 8 GHz, the output impedance of the second-order harmonic can be close to the short condition. This makes it possible to realize an efficiency-enhanced Class F amplification operation.

For example, also in the semiconductor device according to the reference example illustrated in FIG. 23, a stray capacitance is generated between each of the collector wirings connected to the collectors of the unit transistors 20 and the ground bump. However, a normal level of the stray capacitance is insufficient as a capacitance to be used for a harmonic-termination series resonant circuit. In a case of forming a harmonic-termination series resonant circuit by using the first capacitor 21, the capacitance C1 thereof is preferably made to be larger than the stray capacitance that may be normally generated. For example, it is preferable to intentionally expand a part of the collector wiring 31C (FIG. 3) to be used as the lower electrode 21L (FIG. 3) or to provide the capacitor dielectric film 21D (FIG. 5) having a higher permittivity than a surrounding insulating film. In addition, for example, it is preferable to set the combined capacitance of the plurality of first capacitors 21 to 2 pF or more.

The simulation was performed to confirm the advantageous effects obtained by using the configuration of the semiconductor device according to the first embodiment. Specifically, the relationships between an output power and a gain of the semiconductor device according to the first embodiment and of the semiconductor device according to the reference example illustrated in FIG. 23 are obtained by the simulation. Now, the simulation results will be described with reference to FIGS. 7A and 7B.

Figure 7A:
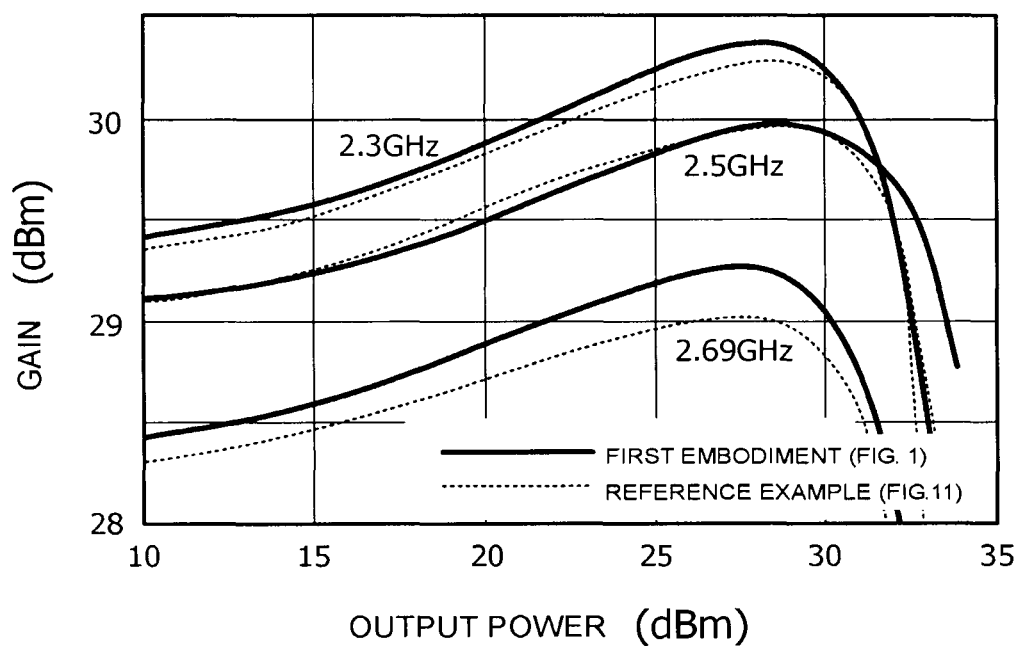
FIG. 7A is a graph illustrating the simulation results of the relationships between an output power and a gain of the semiconductor device according to the first embodiment and of a semiconductor device according to a reference example.
Figure 7B:
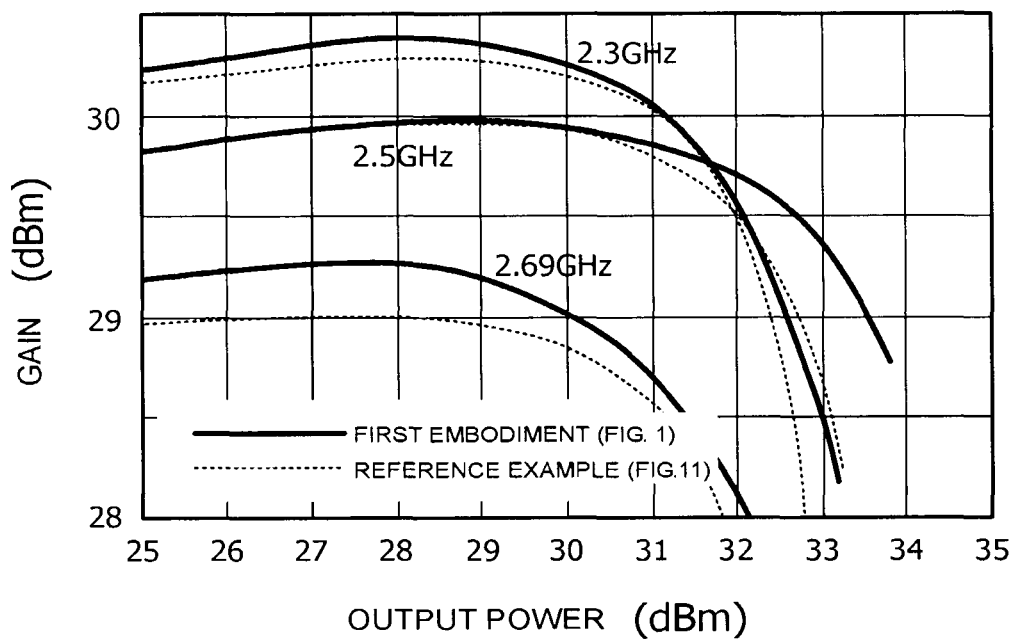
FIG. 7B is a graph in which a part of FIG. 7A is enlarged.

FIG. 7A is a graph illustrating the simulation results of the relationships between an output power and a gain. The horizontal axis represents the output power in "dBm", and the vertical axis represents the gain in "dBm". FIG. 7B illustrates an enlarged range of the output power in FIG. 7A from 25 dBm to 35 dBm.

The thick solid lines in FIGS. 7A and 7B illustrate the simulation results of the gain of the semiconductor device according to the first embodiment illustrated in FIG. 1 while the dashed lines in FIGS. 7A and 7B illustrate the simulation results of the gain of the semiconductor device according to the reference example illustrated in FIG. 23. Note that a circuit as a simulation target that corresponds to the semiconductor device according to the reference example is made by connecting the harmonic-termination series resonant circuit 56 to both ends of the output wiring 50 in FIG. 23. The simulation was performed at the frequencies of 2.3 GHz, 2.5 GHz, and 2.69 GHz.

By using the configuration of the semiconductor device according to the first embodiment, the obtained gain and the saturated output power are larger than those in the reference example at every frequency. For example, the characteristics are improved by a gain of about 0.3 dBm at most and by a saturated output power of about 1 dBm at most. This is because the load impedance with respect to the third-order harmonic is controlled to be on the short side in the first embodiment, and as a result, an efficiency-enhanced inverse Class F amplification operation is performed.

From the simulation results illustrated in FIGS. 7A and 7B, by providing the series resonant circuits 25 (FIG. 1) for the respective unit transistors 20 as in the semiconductor device according to the first embodiment, it is possible to configure an efficiency-enhanced high-frequency amplifier circuit.

Next, a semiconductor device according to a modification of the first embodiment will be described. In the first embodiment, the series resonant circuits 25 (FIG. 1) are connected to all of the plurality of unit transistors 20. As another configuration, the series resonant circuits 25 may be connected to the plurality of unit transistors 20 excluding some of the unit transistors 20. For example, the series resonant circuits 25 may be connected to the plurality of unit transistors 20 that are arranged in a line excluding the unit transistors 20 at both ends.

Although the bipolar transistor is used as each of the unit transistors 20 in the first embodiment, a field-effect transistor (FET) may be used instead of the bipolar transistor. In this case, for example, a gate of the FET is connected to the input electrode, a drain thereof is connected to the output electrode, and a source thereof is connected to the common electrode.

Second Embodiment

Next, a semiconductor device according to a second embodiment will be described with reference to FIG. 8. In the following description, the same configuration as that of the semiconductor device according to the first embodiment will not be repeatedly described.

Figure 8:
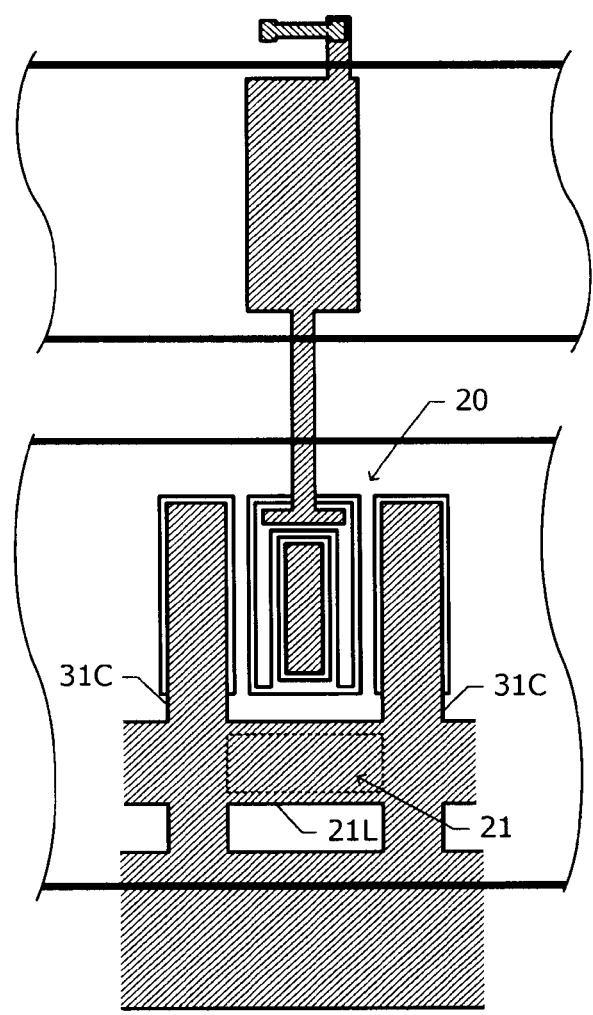
FIG. 8 is a plan view of one of the unit transistors of a semiconductor device according to a second embodiment and a periphery thereof.

FIG. 8 is a plan view of one of the unit transistors 20 of the semiconductor device according to the second embodiment and a periphery thereof. While the lower electrode 21L of the first capacitor 21 (FIG. 3) is connected to the single collector wiring 31C in the corresponding unit transistor 20 in the first embodiment, the lower electrode 21L is connected to both of the two collector wirings 31C in the corresponding unit transistor 20 in the second embodiment.

Advantageous effects that are substantially the same as those in the first embodiment are also obtained in the second embodiment.

Third Embodiment

Next, a semiconductor device according to a third embodiment will be described with reference to FIGS. 9 and 10. In the following description, the same configuration as that of the semiconductor device according to the first embodiment will not be repeatedly described.

Figure 9:
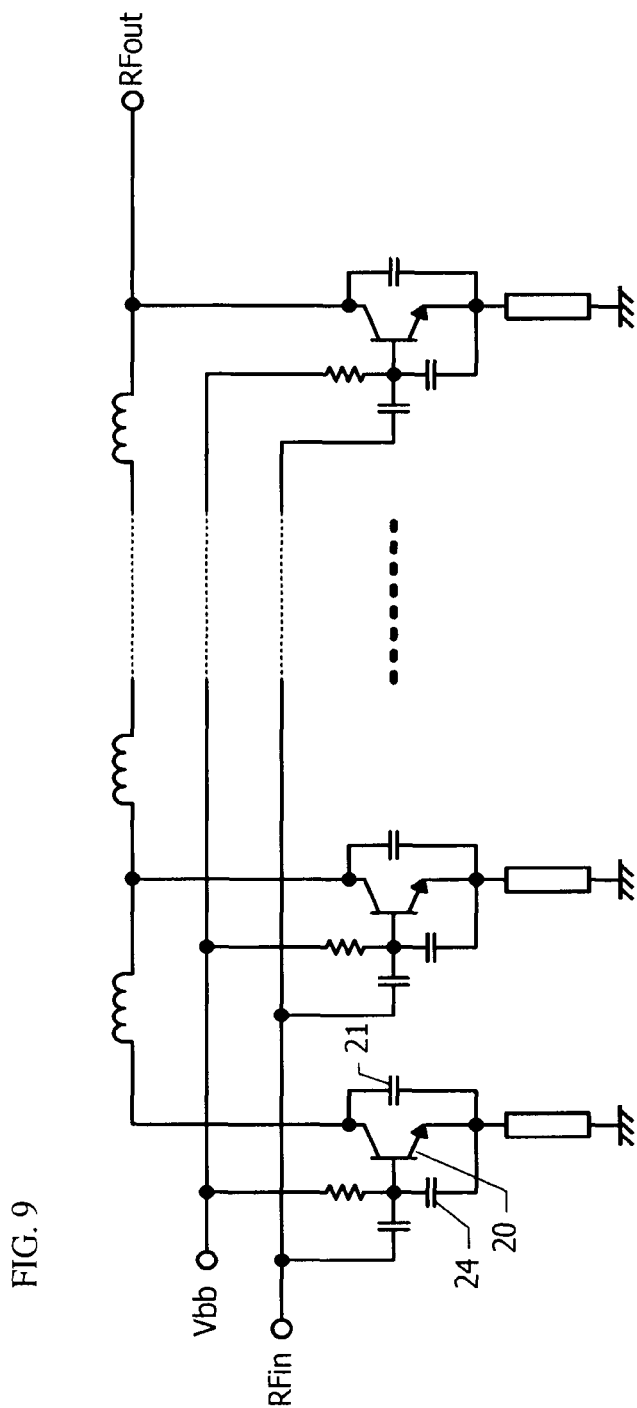
FIG. 9 is an equivalent circuit diagram of a semiconductor device according to a third embodiment.

FIG. 9 is an equivalent circuit diagram of the semiconductor device according to the third embodiment. In the third embodiment, the second capacitor 24 in addition to the first capacitor 21 are connected between the base and the emitter of each of the unit transistors 20.

Figure 10:
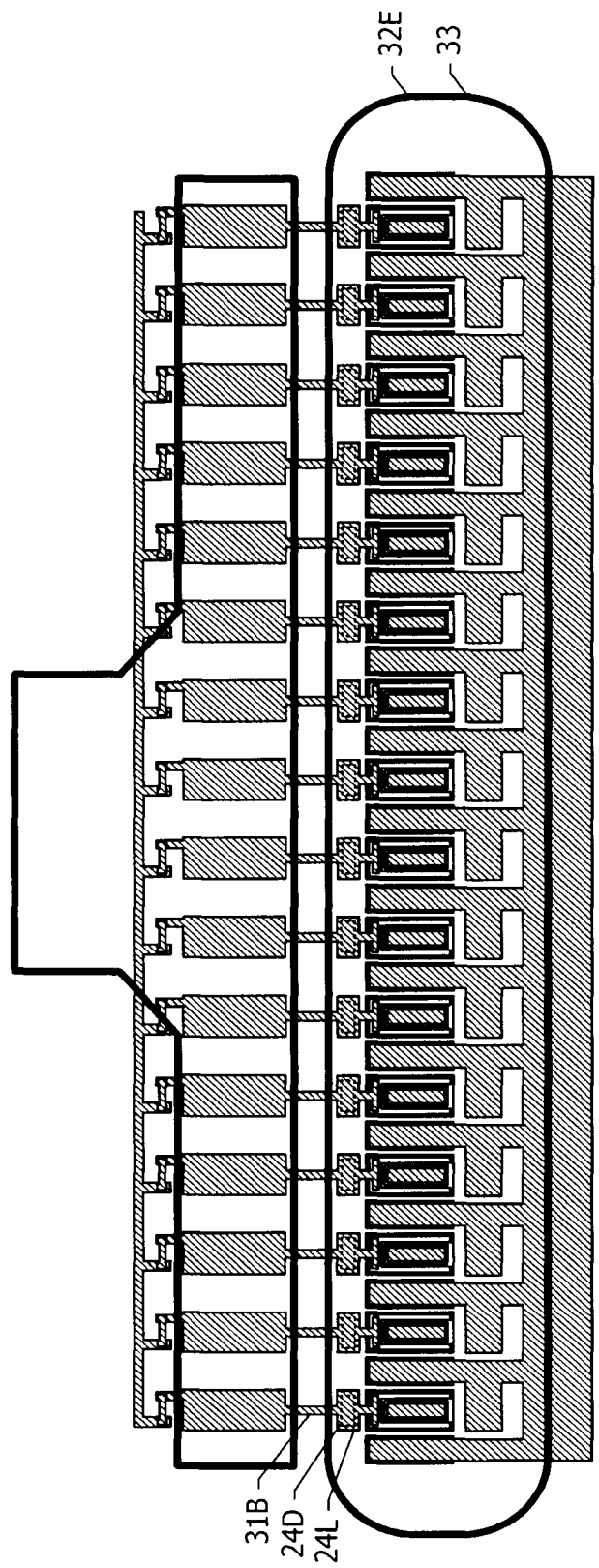
FIG. 10 is a plan view of the semiconductor device according to the third embodiment.

FIG. 10 is a plan view of the semiconductor device according to the third embodiment. A part of the first-layer base wiring 31B is widened to form a lower electrode 24L of the second capacitor 24. The lower electrode 24L is provided inside the second-layer emitter wiring 32E and the ground bump 33 in a plan view. In a region overlapping with the lower electrode 24L, a dielectric film 24D of the second capacitor 24 is provided. A sectional structure of the second capacitor 24 is the same as the sectional structure of the first capacitor 21 (FIG. 5).

In the third embodiment, by connecting the second capacitor 24 to the input side of each of the unit transistors 20, an effect of shaping the waveform of a high-frequency signal is obtained.

Fourth Embodiment

Next, a semiconductor device according to a fourth embodiment will be described with reference to FIGS. 11 and 12. In the following description, the same configuration as that of the semiconductor device according to the first embodiment will not be repeatedly described.

Figure 11:
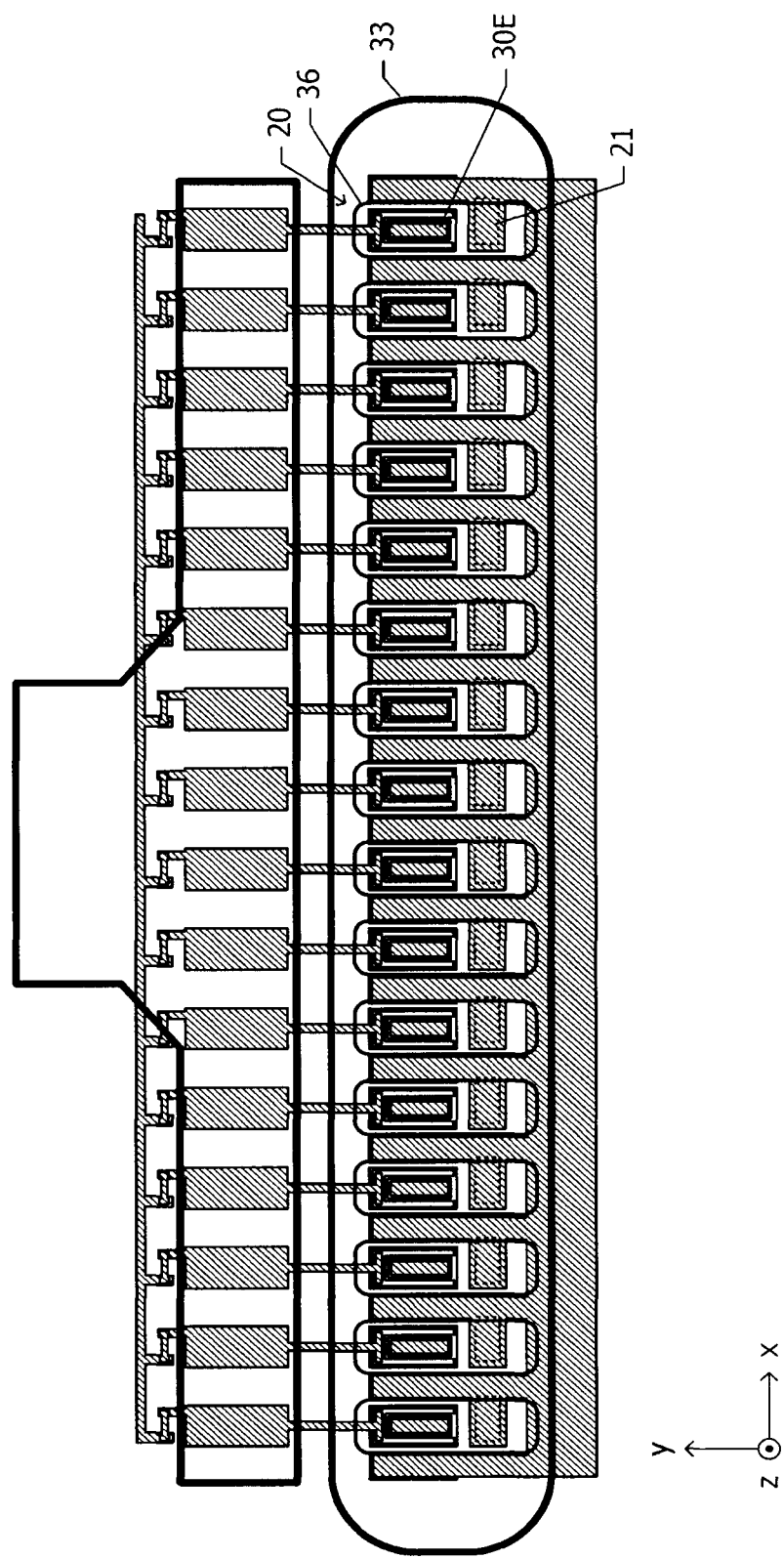
FIG. 11 is a plan view of a semiconductor device according to a fourth embodiment.
Figure 12:
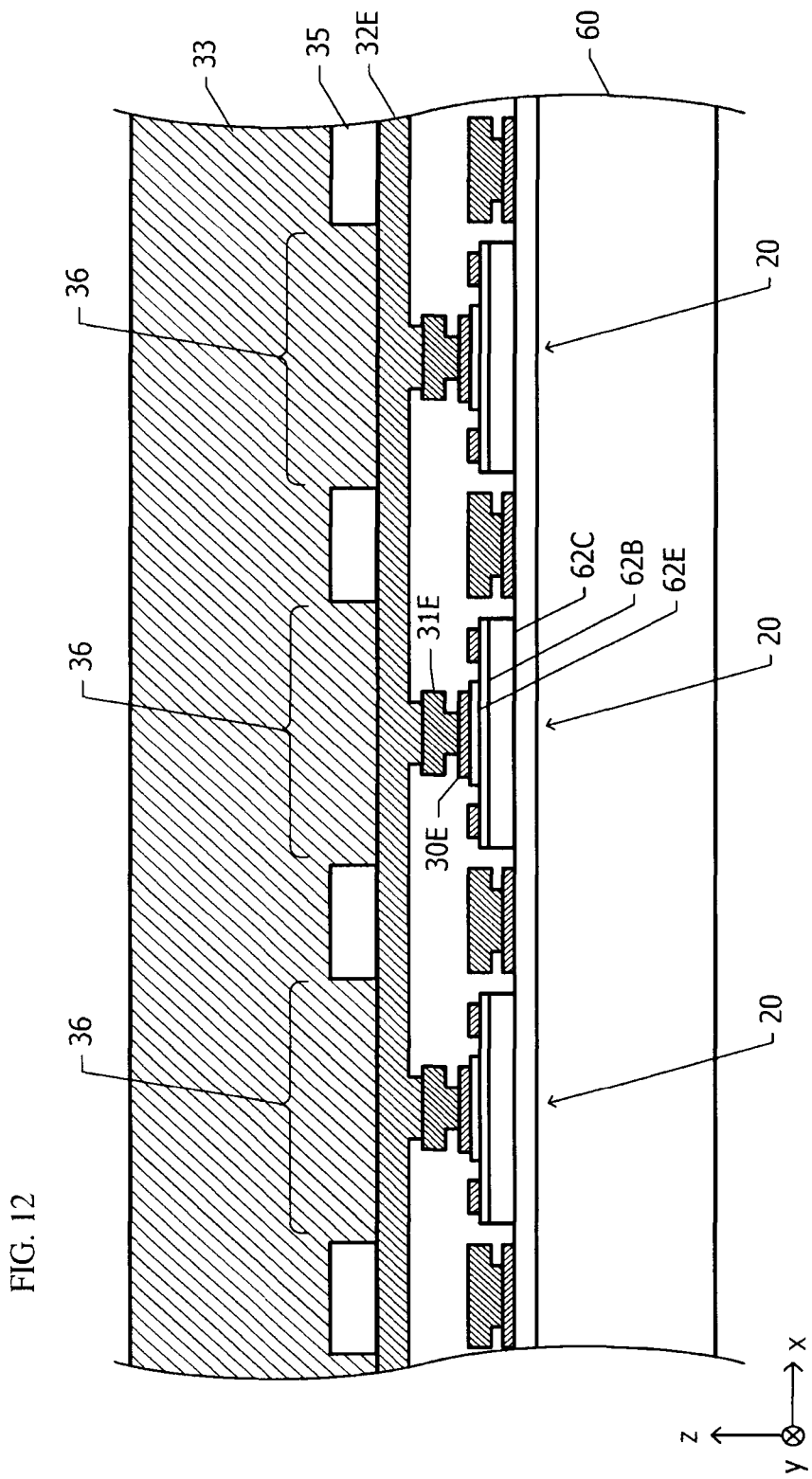
FIG. 12 is a sectional view of the semiconductor device according to the fourth embodiment.

FIGS. 11 and 12 are respectively a plan view and a sectional view of the semiconductor device according to the fourth embodiment. In the first embodiment (FIGS. 2 and 4), the ground bump 33 is formed directly on the second-layer emitter wiring 32E (FIG. 4). In the fourth embodiment, as illustrated in FIG. 12, on the second-layer emitter wiring 32E, an insulating protective film 35 is formed, and on the protective film 35, the ground bump 33 is provided. The ground bump 33 is connected to the second-layer emitter wiring 32E through a plurality of openings 36 (FIGS. 11 and 12) provided in the protective film 35. The protective film 35 is formed using, for example, a SiN single layer film or a stack film of a SiN film and a resin film.

The plurality of openings 36 (FIG. 11) are provided inside the ground bump 33 in a plan view. The plurality of openings 36 are provided so as to correspond to the respective unit transistors 20 and overlap with regions in which the emitter electrodes 30E are provided (regions in which an emitter current flows) and with the first capacitors 21. The openings 36 are successive from the regions in which the emitter current flows to regions in which the first capacitors 21 are provided. In a plan view, the first capacitors 21 and the corresponding openings 36 have the same relative position relationship in all combinations of the first capacitors 21 and the openings 36.

Next, advantageous effects obtained by using the configuration of the semiconductor device according to the fourth embodiment will be described.

In the fourth embodiment, the protective film 35 (FIG. 12) has a function of relieving a stress that is generated by a difference between a coefficient of thermal expansion of a semiconductor portion such as the substrate 60 and a coefficient of thermal expansion of the ground bump 33. This can suppress a decrease in the reliability of the semiconductor device due to the generation of the stress. In addition, since the plurality of openings 36 are provided so as to correspond to the plurality of unit transistors 20, the protective film 35 is provided between the unit transistors 20 that are adjacent to each other. This can enhance the effect of relieving and reducing the stress generated in the region of the unit transistors 20 compared with a case in which a single large opening is provided to fit the ground bump 33.

Each of the first capacitors 21 and a corresponding one of the openings 36 overlap with each other in a plan view. Thus, in each of the first capacitors 21, a current flowing in the first capacitor 21 flows to a ground of a mounted substrate via the ground bump 33 in the corresponding one of the openings 36 immediately above. Accordingly, the inductance components L1 (FIG. 1) that correspond to the respective plurality of unit transistors 20 become substantially uniform. As a result, it is possible to make the frequency characteristics of the harmonic-termination series resonant circuits 25 (FIG. 1) uniform in the plurality of unit transistors 20.

In a plan view, the emitter current flows in the regions in which the emitter electrodes 30E (FIG. 11) are provided. Accordingly, mainly, the emitter layer 62E, the base layer 62B, and the collector layer 62C (FIG. 12) in a region in which the emitter electrode 30E is provided in a plan view generate heat. The generated heat flows to a ground conductor of a mounted substrate through the first-layer emitter wirings 31E, the second-layer emitter wiring 32E, and the ground bump 33. Since the openings 36 are provided so as to overlap with the emitter electrodes 30E in the fourth embodiment, the protective film 35 does not substantially interfere with heat radiation.

Fifth Embodiment

Next, a semiconductor device according to a fifth embodiment will be described with reference to FIGS. 13 to 14B. In the following description, the same configuration as that of the semiconductor device according to the first embodiment (FIGS. 2 and 3) and the fourth embodiment (FIG. 11) will not be repeatedly described.

Figure 13:
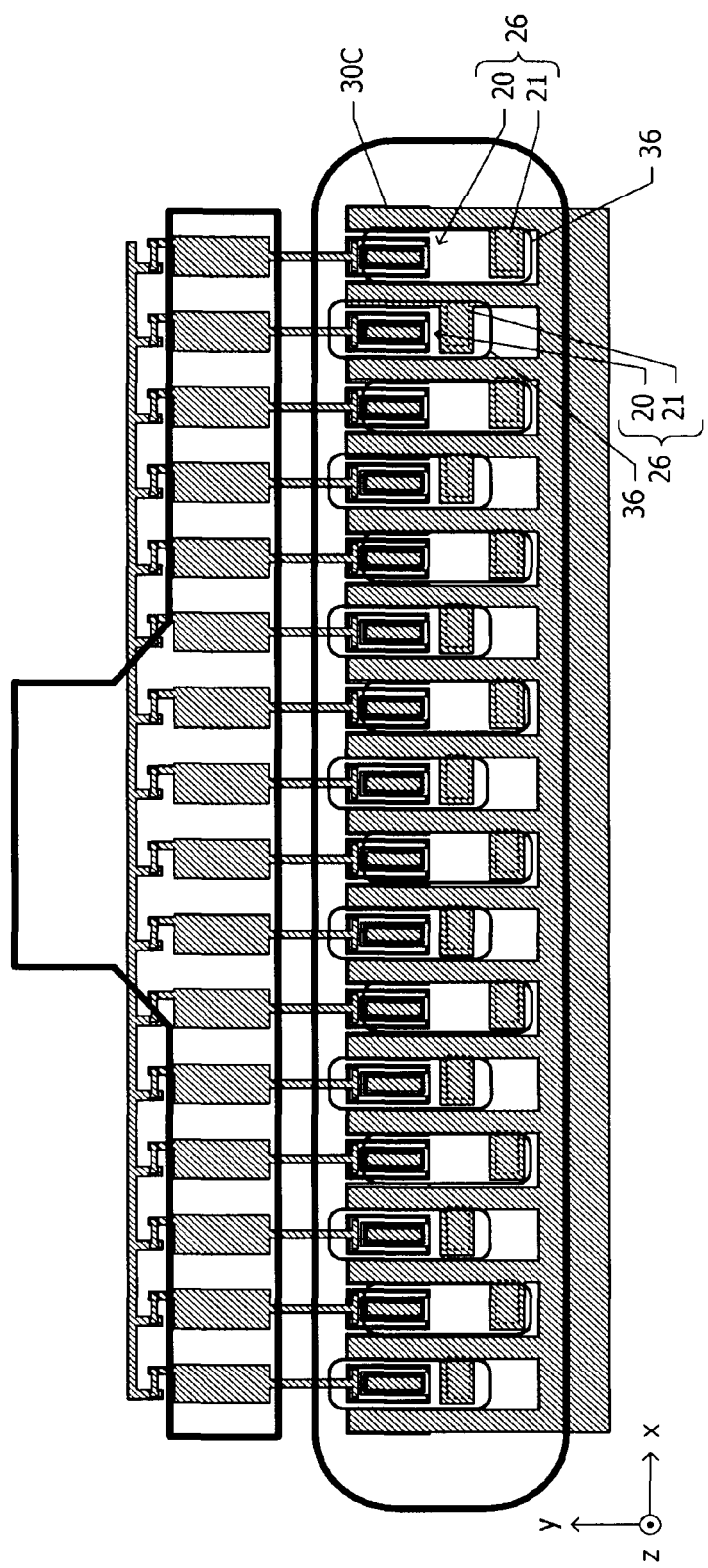
FIG. 13 is a plan view of a semiconductor device according to a fifth embodiment.

FIG. 13 is a plan view of the semiconductor device according to the fifth embodiment. In the first embodiment and the fourth embodiment, the collector electrodes 30C (FIG. 3) and the first capacitors 21 have the same relative position relationship in a plan view in all combinations of the collector electrodes 30C and the first capacitors 21. In contrast, the relative position relationship is different in the fifth embodiment.

In the fifth embodiment, each of the unit transistors 20 and a corresponding one of the first capacitors 21 form a single cell 26, and a plurality of cells 26 are classified into two groups (first group and second group). Some of the plurality of cells 26 belong to the first group, and the others of the plurality of cells 26 belong to the second group. The cells 26 that belong to the first group and the cells 26 that belong to the second group are alternately arranged in the x-axis direction. Among the cells 26 that belong to the same group, the collector electrodes 30C and the first capacitors 21 have the same relative position relationship. Among the cells 26 that belong to different groups, the collector electrodes 30C and the first capacitors 21 have different relative position relationships.

In the fifth embodiment, a current path from the collector electrode 30C of each of the unit transistors 20 that belong to the second group to the first capacitor 21 is longer than a current path from the collector electrode 30C of each of the unit transistors 20 that belong to the first group to the first capacitor 21. As illustrated in FIG. 13, the positions of the collector electrodes 30C in the y-axis direction are the same in all of the unit transistors 20. The first capacitors 21 that belong to the first group and the first capacitors 21 that belong to the second group are arranged at different positions in the y-axis direction. The first capacitors 21 that belong to the same group are arranged at the same position in the y-axis direction.

The arrangement of the plurality of first capacitors 21 can also be expressed as a staggered pattern in the x-axis direction. Such staggered pattern arrangement can produce the following effects: the area thereof can be reduced, and the resonant frequency can be set to two different values as will be described later. In accordance with the arrangement of the first capacitors 21, the openings 36 are also arranged in a staggered pattern in the x-axis direction. The staggered pattern arrangement of the openings 36 increases the dimension in the y-axis direction of the ground bump 33 compared with that in the fourth embodiment (FIG. 11).

Figure 14A:
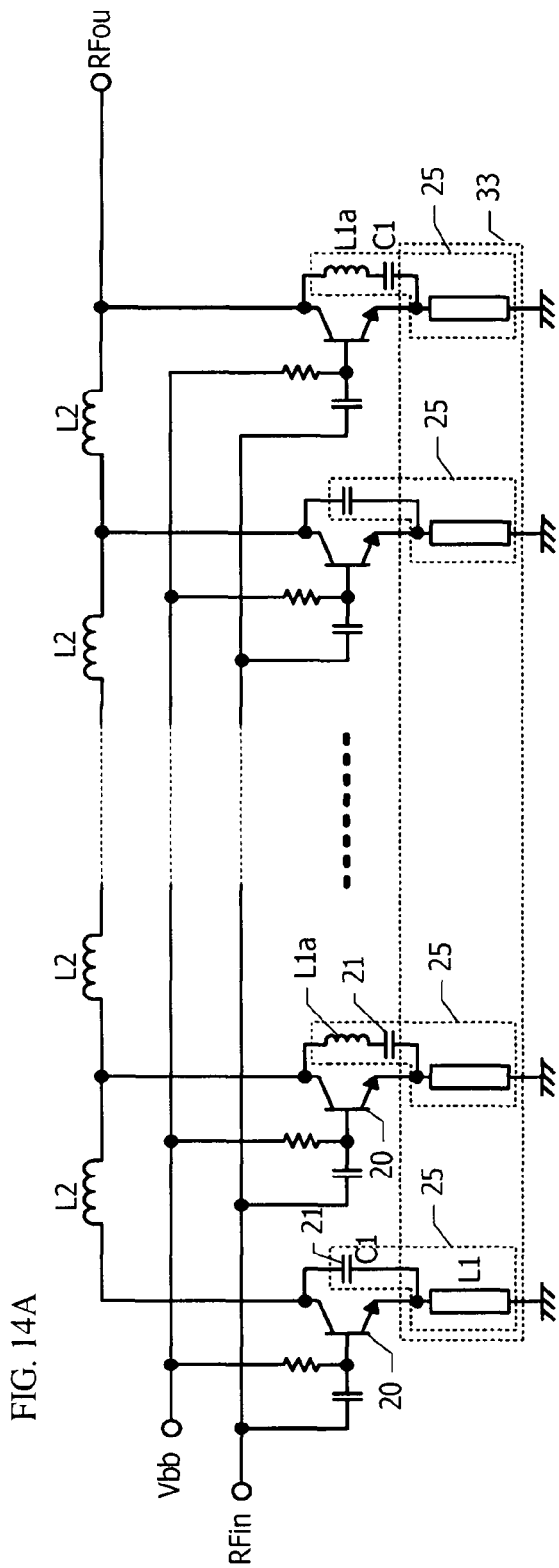
FIG. 14A is an equivalent circuit diagram of the semiconductor device according to the fifth embodiment.

FIG. 14A is an equivalent circuit diagram of the semiconductor device according to the fifth embodiment. In a set of a unit transistor 20 and a first capacitor 21 that belong to the second group, an additional inductance component L1a in accordance with the length of the current path is inserted in series to the first capacitor 21. Thus, the frequency characteristics of the series resonant circuits 25 that belong to the first group and the frequency characteristics of the series resonant circuits 25 that belong to the second group differ from each other.

Figure 14B:
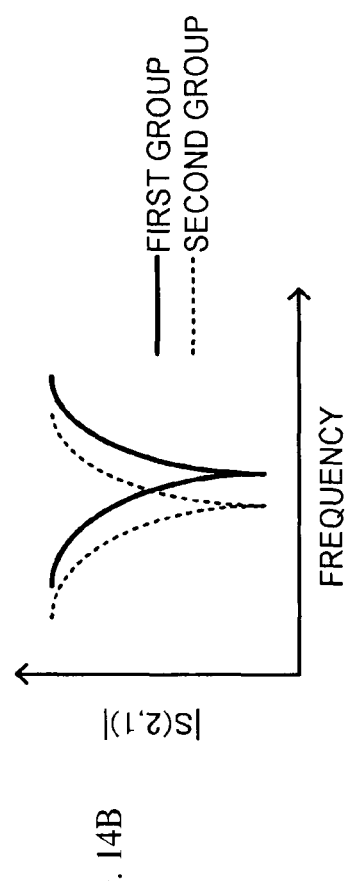
FIG. 14B is a graph illustrating the examples of the frequency dependency of the attenuation of the series resonant circuits that belong to a first group and of series resonant circuits that belong to a second group.

FIG. 14B is a graph illustrating the examples of the bandpass characteristics |S(2,1)| seen from the unit transistors 20 that belong to the first group toward the series resonant circuits 25 and the bandpass characteristics |S(2,1)| seen from the unit transistors 20 that belong to the second group toward the series resonant circuits 25. The inductance components of the series resonant circuits 25 that belong to the second group are larger than the inductance components of the series resonant circuits 25 that belong to the first group. Thus, the resonant frequencies of the series resonant circuits 25 that belong to the second group are lower than the resonant frequencies of the series resonant circuits 25 that belong to the first group. As a result, an extremum of the bandpass characteristics |S(2,1)| in the first group and an extremum of the bandpass characteristics |S(2,1)| in the second group are shifted on the frequency axis.

Next, advantageous effects obtained by using the configuration of the semiconductor device according to the fifth embodiment will be described.

In the fifth embodiment, as illustrated in FIG. 14B, the frequency at which the bandpass characteristic |S(2,1)| reaches the extremum is different between the first group and the second group. This can broaden the band of the amplifier circuit.

In addition, the dimension in the y-axis direction of the ground bump 33 (FIG. 13) according to the fifth embodiment is larger than the dimension in the y-axis direction of the ground bump 33 (FIG. 11) according to the fourth embodiment. This increases a stress that is generated by a difference between a coefficient of thermal expansion of the ground bump 33 and a coefficient of thermal expansion of a semiconductor region such as the substrate 60. In the fifth embodiment, a stress relieving effect by providing the protective film 35 (FIG. 12) and providing the plurality of openings 36 is more remarkable.

Next, a semiconductor device according to a modification of the fifth embodiment will be described with reference to FIG. 15.

Figure 15:
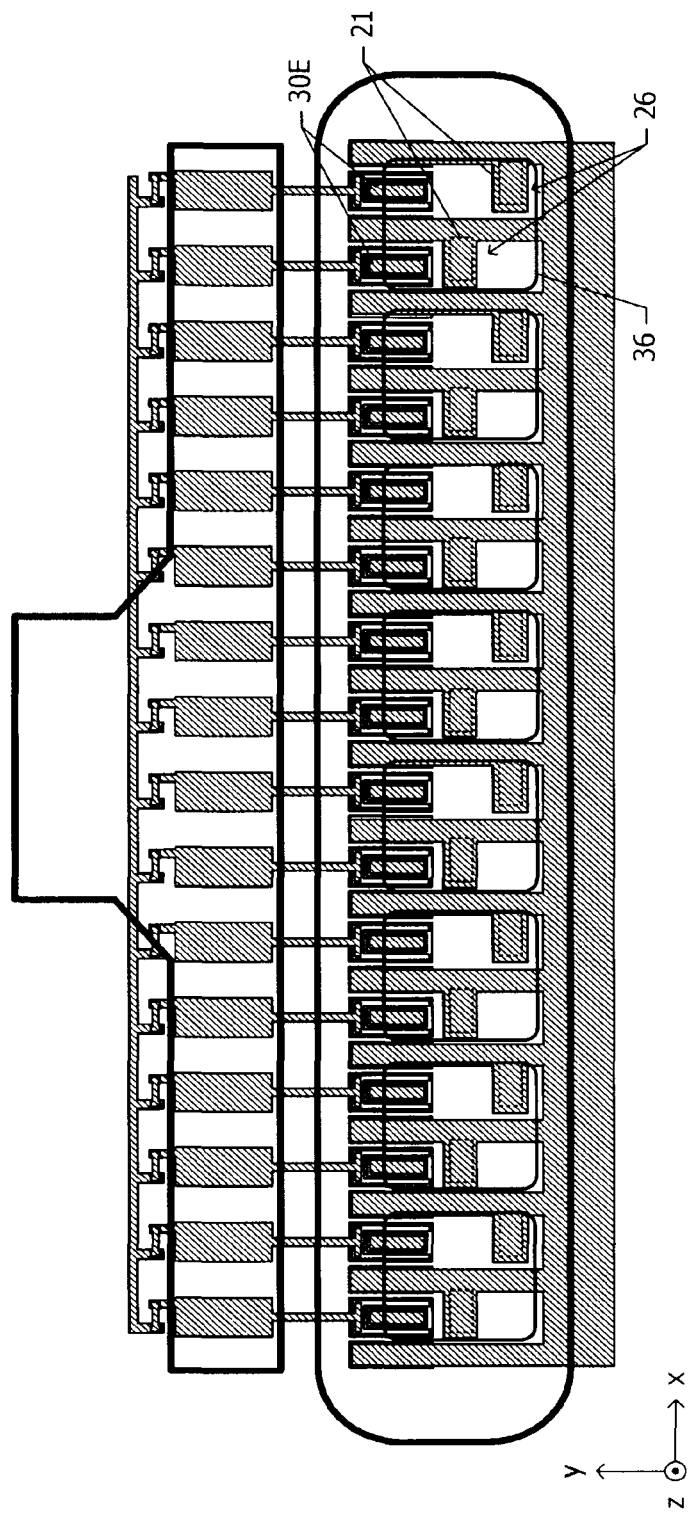
FIG. 15 is a plan view of a semiconductor device according to a modification of the fifth embodiment.

FIG. 15 is a plan view of the semiconductor device according to the modification of the fifth embodiment. In the fifth embodiment, the openings 36 correspond to the respective cells 26. In the modification illustrated in FIG. 15, each one of the openings 36 is provided so as to correspond to two cells 26 that are adjacent to each other in the x-axis direction. One of the two cells 26 corresponding to the opening 36 belongs to the first group, and the other belongs to the second group.

In a plan view, each one of the openings 36 overlaps with two first capacitors 21. Thus, the inductance components of the series resonant circuits 25 of the plurality of cells 26 that belong to the same group can be made uniform.

The parts of the emitter electrodes 30E included in the two cells 26 corresponding to the opening 36 are provided inside the corresponding opening 36. Since the opening 36 and the parts of the emitter electrodes 30E overlap with each other in a plan view, a desired heat radiation effect can be produced. The parts of the emitter electrodes 30E outside the opening 36 are covered with the protective film 35 (FIG. 12). This can produce an effect of relieving the stress generated in the unit transistors 20.

The heat radiation effect can be increased by increasing the area of the regions where the emitter electrodes 30E and the openings 36 overlap with each other. The effect of relieving the stress on the emitter, on the other hand, can be increased by decreasing the area of the regions where the emitter electrodes 30E and the openings 36 overlap with each other.

Sixth Embodiment

Next, a semiconductor device according to a sixth embodiment will be described with reference to FIG. 16. In the following description, the same configuration as that of the semiconductor device according to the fifth embodiment (FIG. 13) will not be repeatedly described.

Figure 16:
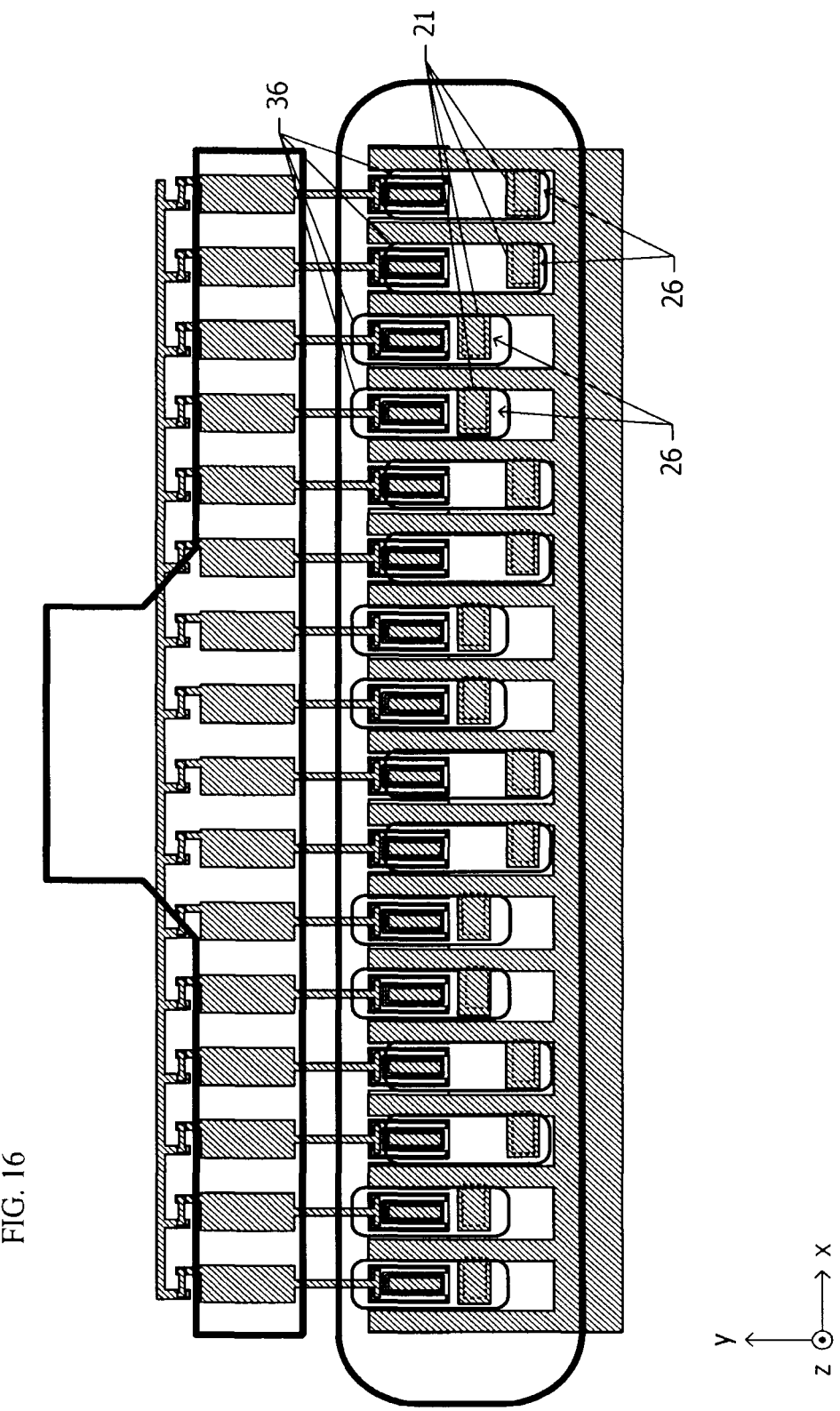
FIG. 16 is a plan view of a semiconductor device according to a sixth embodiment.

FIG. 16 is a plan view of the semiconductor device according to the sixth embodiment. In the fifth embodiment (FIG. 13), the cells 26 that belong to the first group and the cells 26 that belong to the second group are alternately arranged in the x-axis direction. In the sixth embodiment, every two of the cells 26 that are adjacent to each other in the x-axis direction are set as a pair and belong to the same group. The pair of the cells 26 that belong to the first group and the pair of the cells 26 that belong to the second group are alternately arranged in the x-axis direction.

Every two of the plurality of first capacitors 21 that are adjacent to each other in the x-axis direction are set as a pair and arranged in a staggered pattern in the x-axis direction. In accordance with the arrangement of the first capacitors 21, every two of the openings 36 are also set as a pair and arranged in a staggered pattern in the x-axis direction.

As in the fifth embodiment, the stress can be relieved, and the band of the amplifier circuit can be broadened also in the sixth embodiment.

Next, a semiconductor device according to a modification of the sixth embodiment will be described with reference to FIG. 17.

Figure 17:
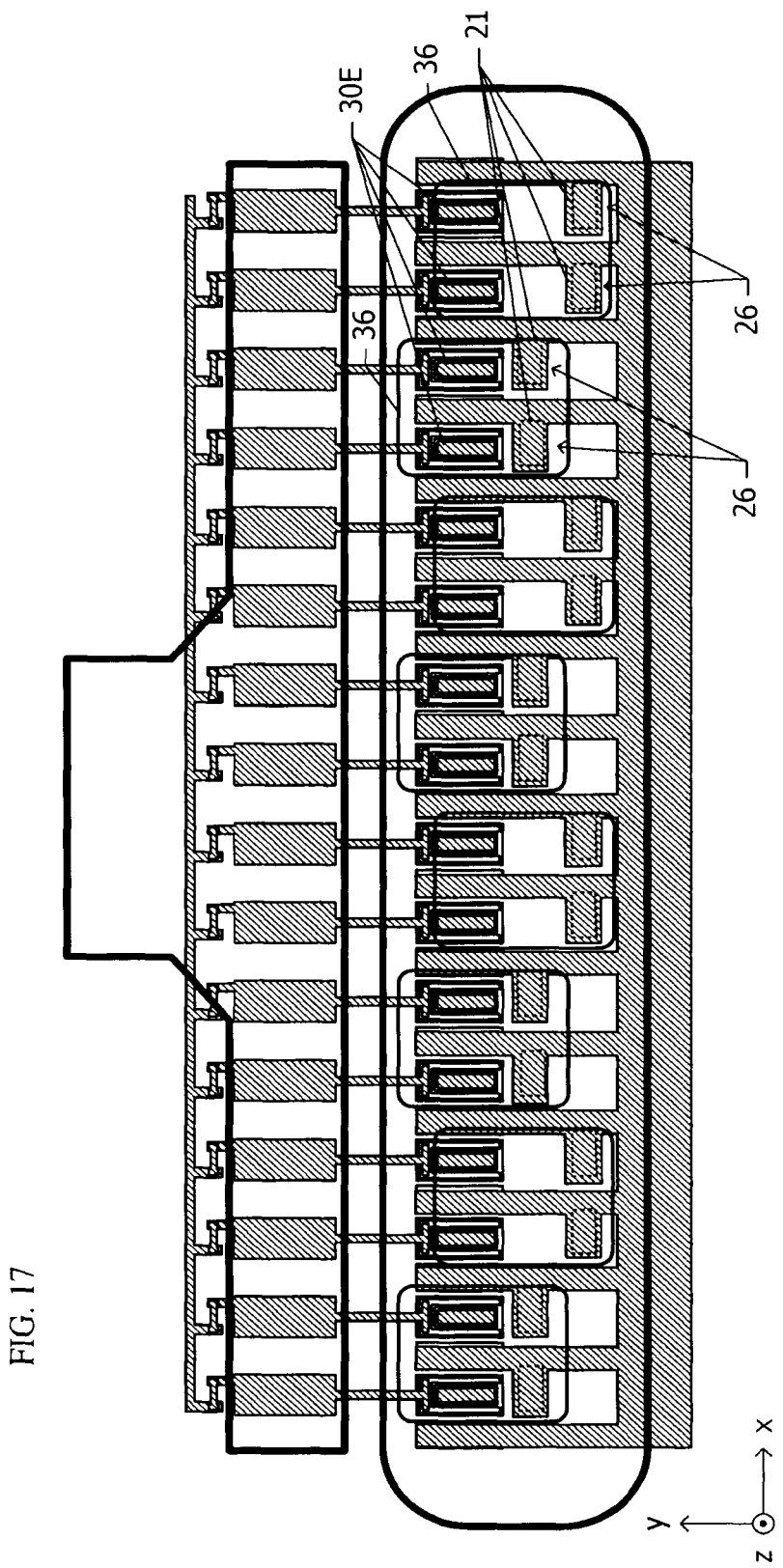
FIG. 17 is a plan view of a semiconductor device according to a modification of the sixth embodiment.

FIG. 17 is a plan view of the semiconductor device according to the modification of the sixth embodiment. In the modification, each one of the openings 36 is provided for two cells 26 in the same group, the cells being adjacent to each other in the x-axis direction. In a plan view, each one of the openings 36 overlaps with two first capacitors 21 and the emitter electrodes 30E of two unit transistors 20.

In the sixth embodiment illustrated in FIG. 16, there are a greater number of the openings 36 than the openings 36 in the modification illustrated in FIG. 17. This enhances the stress relieving effect in the sixth embodiment. In contrast, in the modification illustrated in FIG. 17, the total area of the openings 36 is larger than that in the sixth embodiment illustrated in FIG. 16. This enhances the heat radiation effect in the modification. The configuration according to the sixth embodiment (FIG. 16) or the configuration according to the modification (FIG. 17) may be determined on the basis of which of the stress relieving effect or the heat radiation effect is desired.

Next, a semiconductor device according to another modification of the sixth embodiment will be described with reference to FIG. 18.

Figure 18:
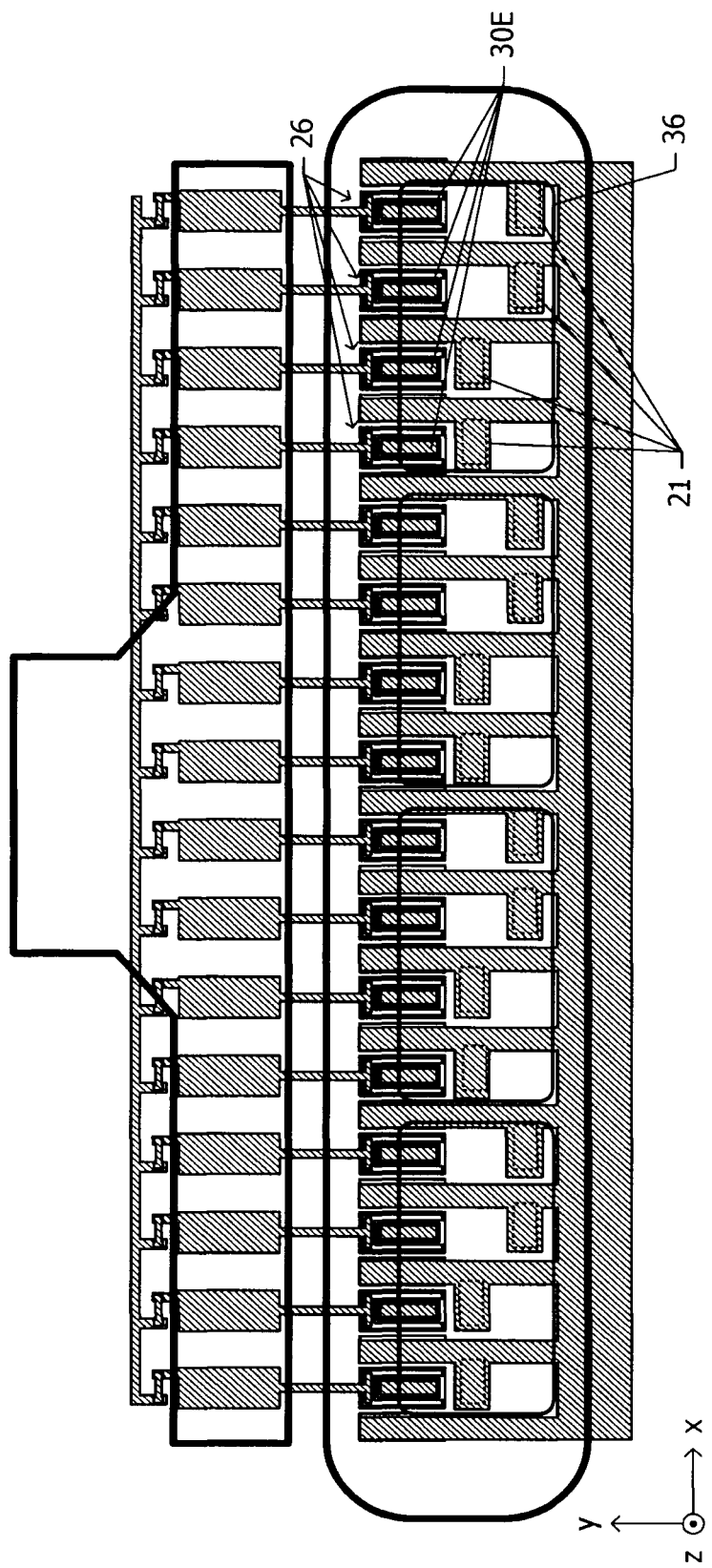
FIG. 18 is a plan view of a semiconductor device according to another modification of the sixth embodiment.

FIG. 18 is a plan view of the semiconductor device according to this modification. Each of the openings 36 is provided for a corresponding one of the cells 26 in the sixth embodiment (FIG. 16), and each of the openings 36 is provided for two cells 26 in the modification (FIG. 17) of the sixth embodiment. In the modification illustrated in FIG. 18, each of the openings 36 is provided for four cells 26 that are successive in the x-axis direction.

In a plan view, each of the openings 36 overlaps with four first capacitors 21. In addition, each of the openings 36 overlaps with parts of four emitter electrodes 30E, and the remaining parts are provided outside the openings 36.

In the modification illustrated in FIG. 18, the total area of the openings 36 is larger than that in the modification illustrated in FIG. 17. This enhances the heat radiation effect in this modification. In addition, parts of the emitter electrodes 30E are provided outside the openings 36. This can enhance the stress relieving effect as desired.

Next, a semiconductor device according to a still another modification of the sixth embodiment will be described with reference to FIG. 19.

Figure 19:
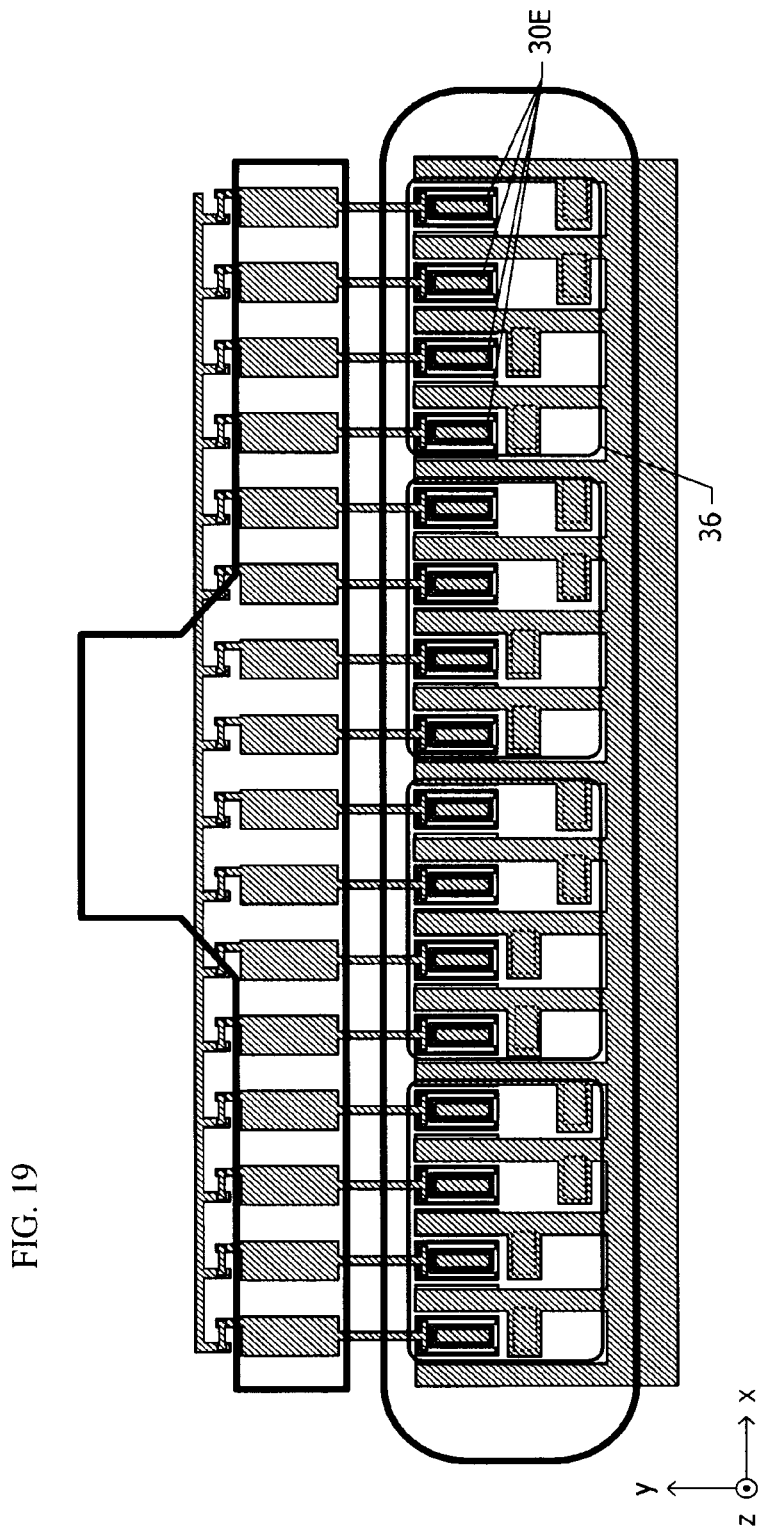
FIG. 19 is a plan view of a semiconductor device according to still another modification of the sixth embodiment.

FIG. 19 is a plan view of the semiconductor device according to this modification. While parts of the emitter electrodes 30E are provided outside the openings 36 in the example illustrated in FIG. 18, the emitter electrodes 30E are entirely provided inside the openings 36 in the modification illustrated in FIG. 19. The openings 36 have a larger area in the modification illustrated in FIG. 19 than in the modification illustrated in FIG. 18. This can enhance the heat radiation effect in the modification illustrated in FIG. 19. In contrast, the stress relieving effect can be enhanced in the example illustrated in FIG. 18.

Seventh Embodiment

Next, a semiconductor device according to a seventh embodiment will be described with reference to FIGS. 20A and 20B. In the following description, the same configuration as that of the semiconductor device according to the fifth embodiment (FIG. 13) will not be repeatedly described.

Figures 20A, 20B:
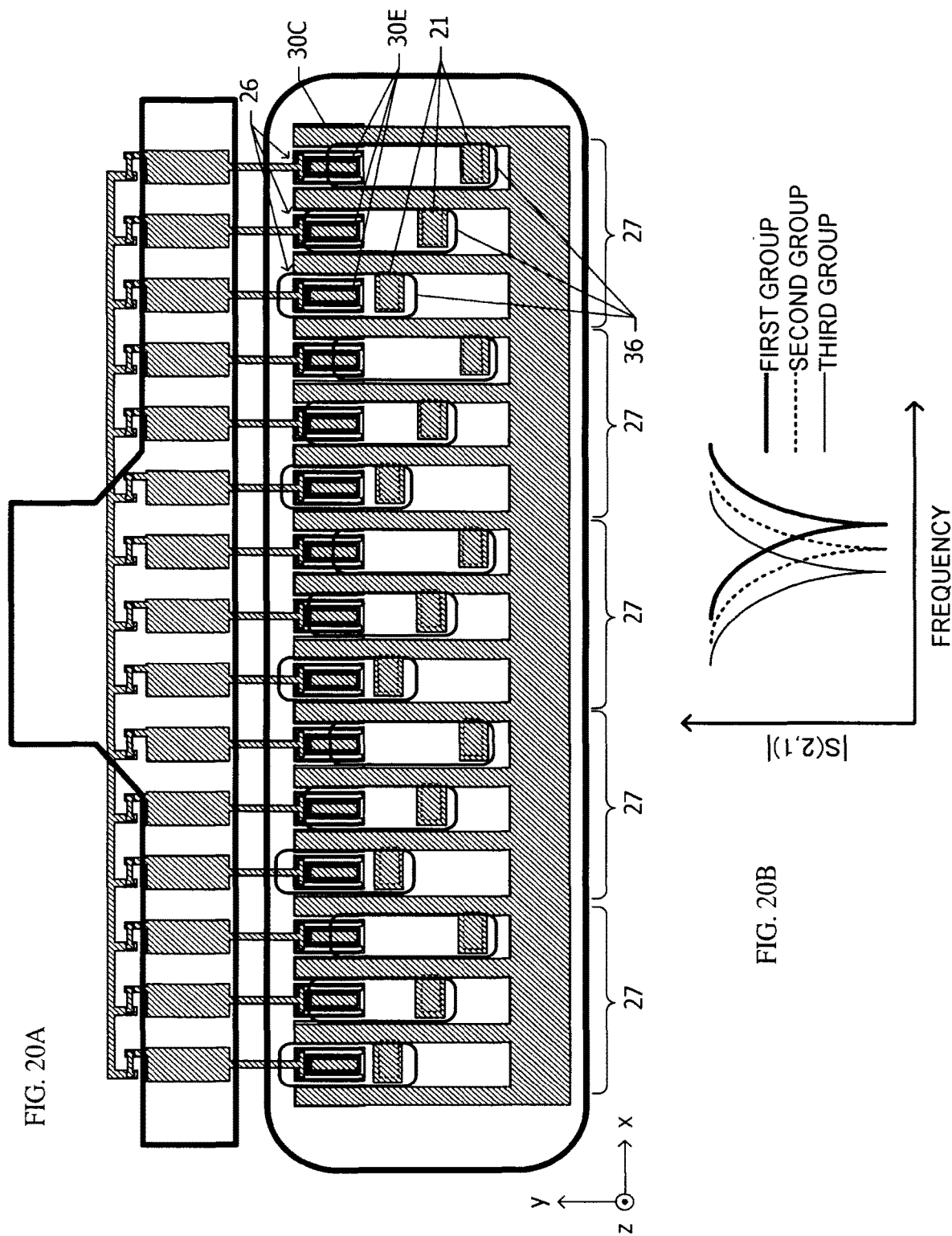
FIG. 20A is a plan view of a semiconductor device according to a seventh embodiment.
FIG. 20B is a graph illustrating the examples of the frequency dependency of the attenuation of the series resonant circuits that belong to a first group, of a series resonant circuits that belong to a second group, and of a series resonant circuits that belong to a third group.

FIG. 20A is a plan view of the semiconductor device according to the seventh embodiment. While the plurality of cells 26 are classified into two groups in the fifth embodiment, the plurality of cells 26 are classified into three groups in the seventh embodiment. Comparing the length of the current path from each of the collector electrodes 30C in the same group to a corresponding one of the first capacitors 21, the current path is longer in the order of a first group, a second group, and a third group. Thus, the inductance component of the series resonant circuit 25 (FIG. 1) is larger in the order of the first group, the second group, and the third group. In addition, the resonant frequency of the series resonant circuit 25 is lower in the order of the first group, the second group, and the third group.

All the groups have the same number of the cells 26. A cell 26 that belongs to the first group, a cell 26 that belongs to the second group, and a cell 26 that belongs to the third group are arranged one by one in order in the x-axis direction to form a unit 27. A plurality of units 27 are arranged in the x-axis direction.

An opening 36 is provided for each of the cells 26. In the first group and the second group, the emitter electrodes 30E are entirely provided inside the openings 36. In the third group, only parts of the emitter electrodes 30E of the cells 26 are provided inside the openings 36.

FIG. 20B is a graph illustrating the bandpass characteristics |S(2,1)| seen from the unit transistors 20 that belong to the first group, the second group, and the third group toward the series resonant circuits 25 (FIG. 1). The frequency at which the bandpass characteristic |S(2,1)| reaches an extremum is lower in the order of the first group, the second group, and the third group. This is because the plurality of the series resonant circuits 25 are formed by the same capacitance and three types of inductance components.

Next, advantageous effects obtained by using the configuration of the semiconductor device according to the seventh embodiment will be described.

The cells 26 in the semiconductor device according to the seventh embodiment are classified into three types of groups in which the frequency at which the bandpass characteristic |S(2,1)| reaches the extremum differs. Thus, the band can be broadened compared with the semiconductor device according to the fifth embodiment (FIG. 13).

Next, semiconductor devices according to the modifications of the seventh embodiment will be described with reference to FIGS. 21 and 22.

Figure 21:
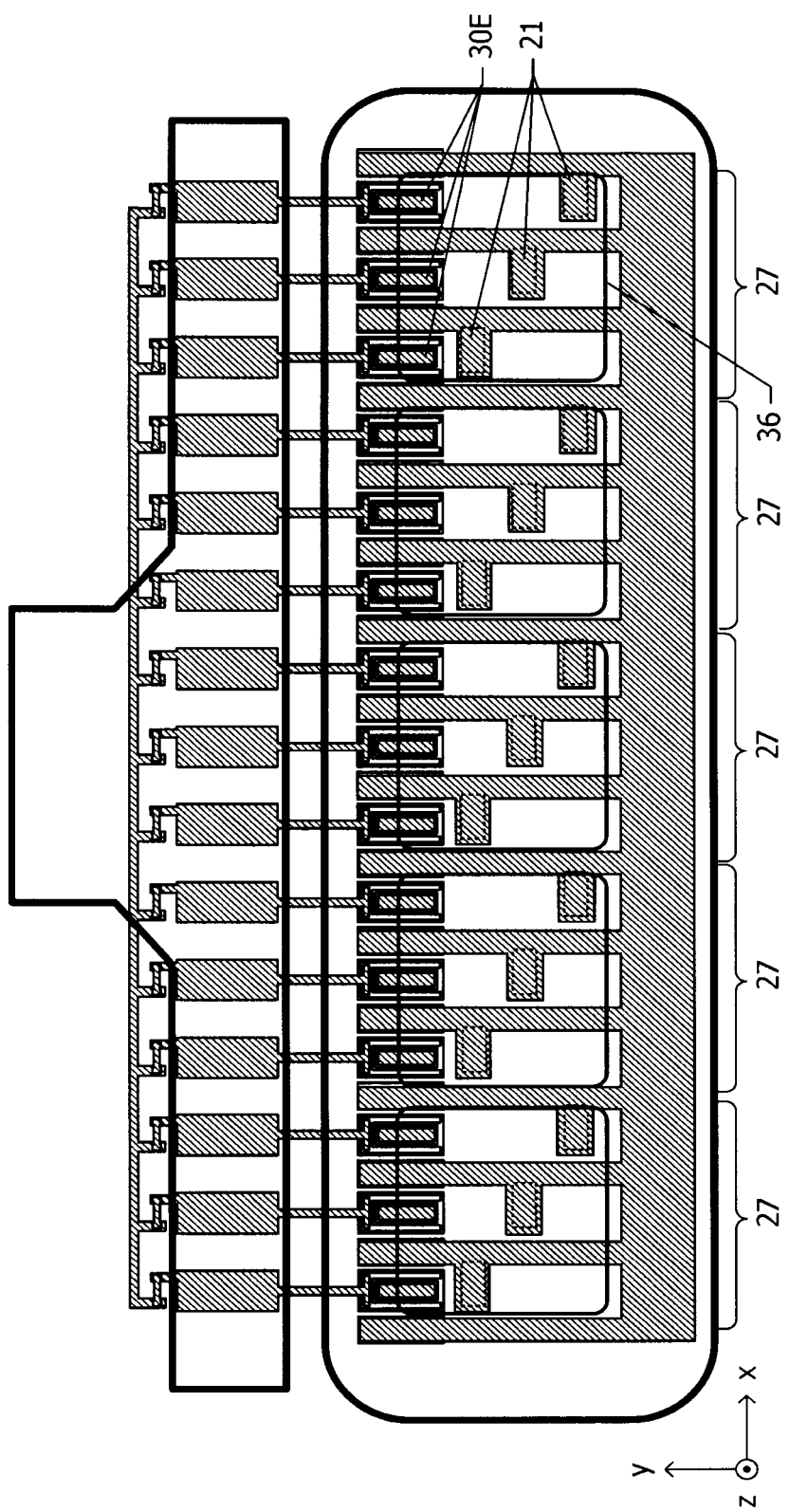
FIG. 21 is a plan view of a semiconductor device according to a modification of the seventh embodiment.
Figure 22:
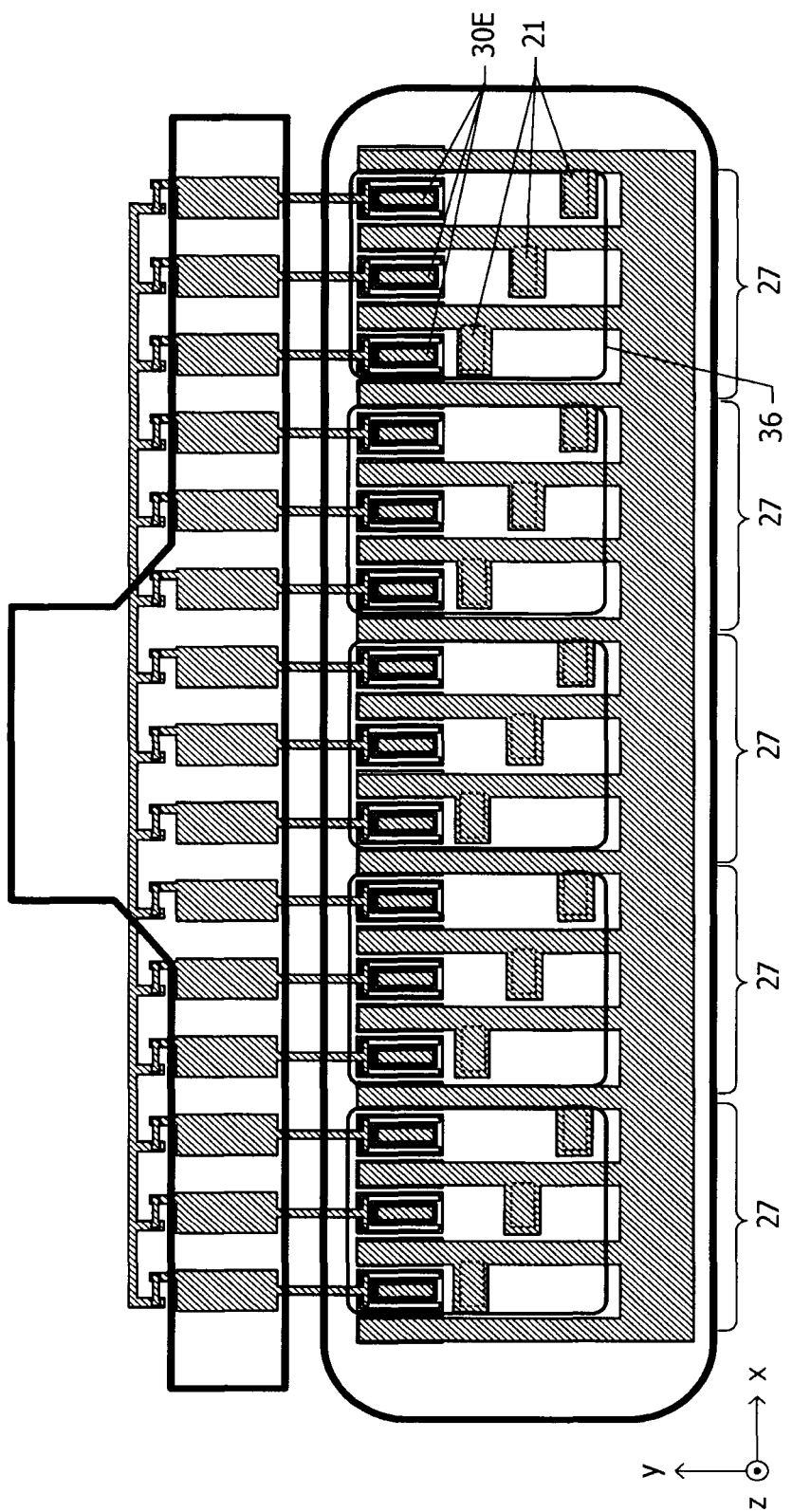
FIG. 22 is a plan view of a semiconductor device according to another modification of the seventh embodiment.

FIGS. 21 and 22 are each a plan view of the semiconductor device according to a modification of the seventh embodiment. While the openings 36 are provided for the respective cells 26 in the seventh embodiment (FIG. 20A), the openings 36 are provided for each of the units 27 in the modifications illustrated in FIGS. 21 and 22. Each one of the openings 36 overlaps with three first capacitors 21.

In the modification illustrated in FIG. 21, parts of the emitter electrodes 30E are provided inside the openings 36, and the remaining parts are provided outside the openings 36. In the modification illustrated in FIG. 22, the emitter electrodes 30E are entirely provided inside the openings 36.

The stress relieving effect is enhanced in the modification illustrated in FIG. 21 compared with the modification illustrated in FIG. 22. The heat radiation effect is enhanced in the modification illustrated in FIG. 22 compared with the modification illustrated in FIG. 21.

The above embodiments are examples, and obviously, parts of the configurations illustrated in different embodiments may be replaced or combined. Substantially the same function effects of the same configurations in a plurality of embodiments are not repeatedly described in each of the embodiments. In addition, the present disclosure is not limited to the above embodiments. For example, it is obvious to a person skilled in the art that various modifications, improvements, combinations, and the like are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a plurality of unit transistors provided on a substrate, the plurality of unit transistors each including an output electrode for outputting an output signal, an input electrode for inputting an input signal, and a common electrode, the plurality of unit transistors being connected in parallel to each other;
a ground bump provided on the substrate, the ground bump being connected to the common electrode of each of the plurality of unit transistors; and
a plurality of first capacitors each provided for a corresponding one of the plurality of unit transistors, the plurality of first capacitors each connecting the output electrode of the corresponding one of the plurality of unit transistors and the ground bump to each other,
wherein the plurality of first capacitors are provided inside the ground bump in a plan view,
wherein the common electrode of each of the plurality of unit transistors, and each of the plurality of first capacitors, are connected to a same ground via at least one inductance component,
wherein the output electrode of each of the plurality of unit transistors is connected to a common RF output terminal via a common output line, and
wherein the common output line comprises a plurality of inductance components connected in series with each other, each of the plurality of inductance components being connected at one end to the output electrode of a corresponding one of the plurality of unit transistors.

2. The semiconductor device according to claim 1, wherein a combined capacitance obtained by connecting the plurality of first capacitors in parallel is less than or equal to 5 pF.

3. The semiconductor device according to claim 1, further comprising a plurality of second capacitors each provided for a corresponding one of the plurality of unit transistors, the plurality of second capacitors each connecting the input electrode of the corresponding one of the plurality of unit transistors and the ground bump to each other.

4. The semiconductor device according to claim 1, wherein a capacitance of the corresponding one of the first capacitors and an inductance component of the ground bump and a current path from the output electrode of each of the unit transistors to the ground bump via a corresponding one of the first capacitors constitute a harmonic-termination series resonant circuit.

5. The semiconductor device according to claim 1, further comprising:
an insulating film provided on the substrate and covering the plurality of unit transistors;
a ground wiring provided on the insulating film and connected to the common electrodes of the plurality of unit transistors through a plurality of first openings provided in the insulating film; and a protective film provided on the insulating film and covering the ground wiring, wherein the ground bump is provided on the protective film and connected to the ground wiring through a plurality of second openings provided in the insulating film, and wherein the plurality of second openings are provided inside the ground bump in a plan view.

6. The semiconductor device according to claim 5, wherein each of the first capacitors overlaps with a corresponding one of the second openings in a plan view.

7. The semiconductor device according to claim 5, wherein each of the plurality of unit transistors is a bipolar transistor including a collector layer, a base layer, and an emitter layer, and wherein, in a plan view, each of the second openings is successive from regions in which an emitter current flows to regions in which the first capacitors are provided.

8. The semiconductor device according to claim 1, wherein the plurality of first capacitors have substantially a same capacitance, and current paths from the output electrodes of the plurality of unit transistors to the ground bump via the first capacitors have substantially a same inductance component.

9. The semiconductor device according to claim 8, wherein the output electrodes and the first capacitors in the plurality of unit transistors have a same relative position relationship in a plan view.

10. The semiconductor device according to claim 1, wherein the plurality of first capacitors have substantially a same capacitance, the plurality of unit transistors are classified into a plurality of groups, each of the plurality of unit transistors belongs to any of the plurality of groups, and current paths from the output electrodes of the plurality of unit transistors belonging to a same group to the ground bump via the first capacitors have substantially a same inductance component.

11. The semiconductor device according to claim 10, wherein the output electrodes and the first capacitors have a same relative position relationship within the same group and have different relative position relationships between different groups in a plan view.

12. The semiconductor device according to claim 2, further comprising a plurality of second capacitors each provided for a corresponding one of the plurality of unit transistors, the plurality of second capacitors each connecting the input electrode of the corresponding one of the plurality of unit transistors and the ground bump to each other.

13. The semiconductor device according to claim 2, wherein a capacitance of the corresponding one of the first capacitors and an inductance component of the ground bump and a current path from the output electrode of each of the unit transistors to the ground bump via a corresponding one of the first capacitors constitute a harmonic-termination series resonant circuit.

14. The semiconductor device according to claim 3, wherein a capacitance of the corresponding one of the first capacitors and an inductance component of the ground bump and a current path from the output electrode of each of the unit transistors to the ground bump via a corresponding one of the first capacitors constitute a harmonic-termination series resonant circuit.

15. The semiconductor device according to claim 2, further comprising:

an insulating film provided on the substrate and covering the plurality of unit transistors;

a ground wiring provided on the insulating film and connected to the common electrodes of the plurality of unit transistors through a plurality of first openings provided in the insulating film; and a protective film provided on the insulating film and covering the ground wiring, wherein the ground bump is provided on the protective film and connected to the ground wiring through a plurality of second openings provided in the insulating film, and wherein the plurality of second openings are provided inside the ground bump in a plan view.

16. The semiconductor device according to claim 1, wherein each of the plurality of unit transistors is part of a same amplifier element.

* * * * *